US012205640B2

(12) United States Patent
Grobis et al.

(10) Patent No.: US 12,205,640 B2
(45) Date of Patent: Jan. 21, 2025

(54) OVERWRITE READ METHODS FOR RESISTANCE SWITCHING MEMORY DEVICES

(71) Applicant: SanDisk Technologies LLC, Addison, TX (US)

(72) Inventors: Michael K. Grobis, Campbell, CA (US); Daniel Bedau, San Jose, CA (US); Christopher J. Petti, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 622 days.

(21) Appl. No.: 17/375,993

(22) Filed: Jul. 14, 2021

(65) Prior Publication Data

US 2021/0343338 A1 Nov. 4, 2021

Related U.S. Application Data

(63) Continuation of application No. 16/502,067, filed on Jul. 3, 2019, now abandoned.

(60) Provisional application No. 62/858,402, filed on Jun. 7, 2019.

(51) Int. Cl.
*G11C 13/00* (2006.01)
*G06F 11/10* (2006.01)
*G11C 11/16* (2006.01)

(52) U.S. Cl.
CPC ........ *G11C 13/004* (2013.01); *G06F 11/1068* (2013.01); *G11C 11/1673* (2013.01); *G11C 13/0026* (2013.01); *G11C 13/0033* (2013.01); *G11C 13/0069* (2013.01); *G11C 2013/0057* (2013.01)

(58) Field of Classification Search
CPC .............. G11C 13/004; G11C 13/0026; G11C 13/0033; G11C 13/0069; G11C 11/1673; G11C 2013/0057
USPC ......................................................... 365/158
See application file for complete search history.

(56) References Cited

U.S. PATENT DOCUMENTS

| | | | | |
|---|---|---|---|---|
| 7,286,429 B1 * | 10/2007 | Liaw | ................... | G11C 13/0004 365/158 |
| 8,281,221 B2 * | 10/2012 | Sakimura | ............ | G11C 11/1675 714/764 |
| 9,691,463 B1 | 6/2017 | Worledge | | |
| 2003/0107916 A1 | 6/2003 | Ooishi | | |
| 2005/0195644 A1 | 9/2005 | Ikegawa et al. | | |
| 2006/0098498 A1 | 5/2006 | Jeong et al. | | |

(Continued)

OTHER PUBLICATIONS

Requirement for Restriction dated Aug. 11, 2020 in U.S. Appl. No. 16/502,067.

(Continued)

*Primary Examiner* — Connie C Yoha
(74) *Attorney, Agent, or Firm* — Vierra Magen Marcus LLP

(57) ABSTRACT

A method is provided that includes reading a plurality of resistance-switching memory cells comprising a block of data, decoding the block of data using an error correction code decoder, and based on results of the decoding, selectively performing an overwrite-read process to read the block of data. The overwrite read process determines a change in resistance of the resistance-switching memory cells in response to a write pulse.

18 Claims, 24 Drawing Sheets

(56) References Cited

U.S. PATENT DOCUMENTS

2015/0364199 A1* 12/2015 Kang .................. H10B 12/315
365/185.11
2023/0326506 A1* 10/2023 Grobis ................. G11C 11/161
365/158

OTHER PUBLICATIONS

Response to Requirement for Restriction dated Sep. 2, 2020 in U.S. Appl. No. 16/502,067.
Office Action dated Dec. 7, 2020 in U.S. Appl. No. 16/502,067.
Response to Office Action dated Feb. 25, 2021 in U.S. Appl. No. 16/502,067.
Final Office Action dated Apr. 22, 2021 in U.S. Appl. No. 16/502,067.

* cited by examiner

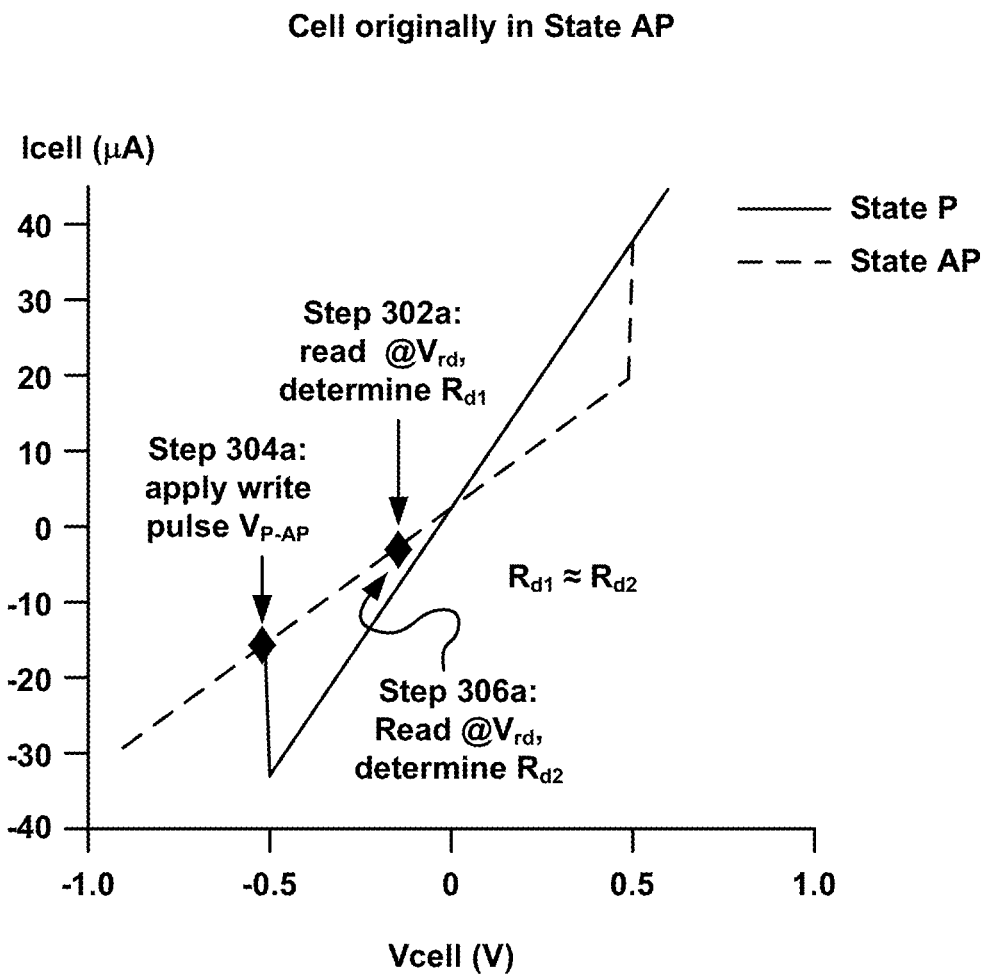
FIG. 3B1

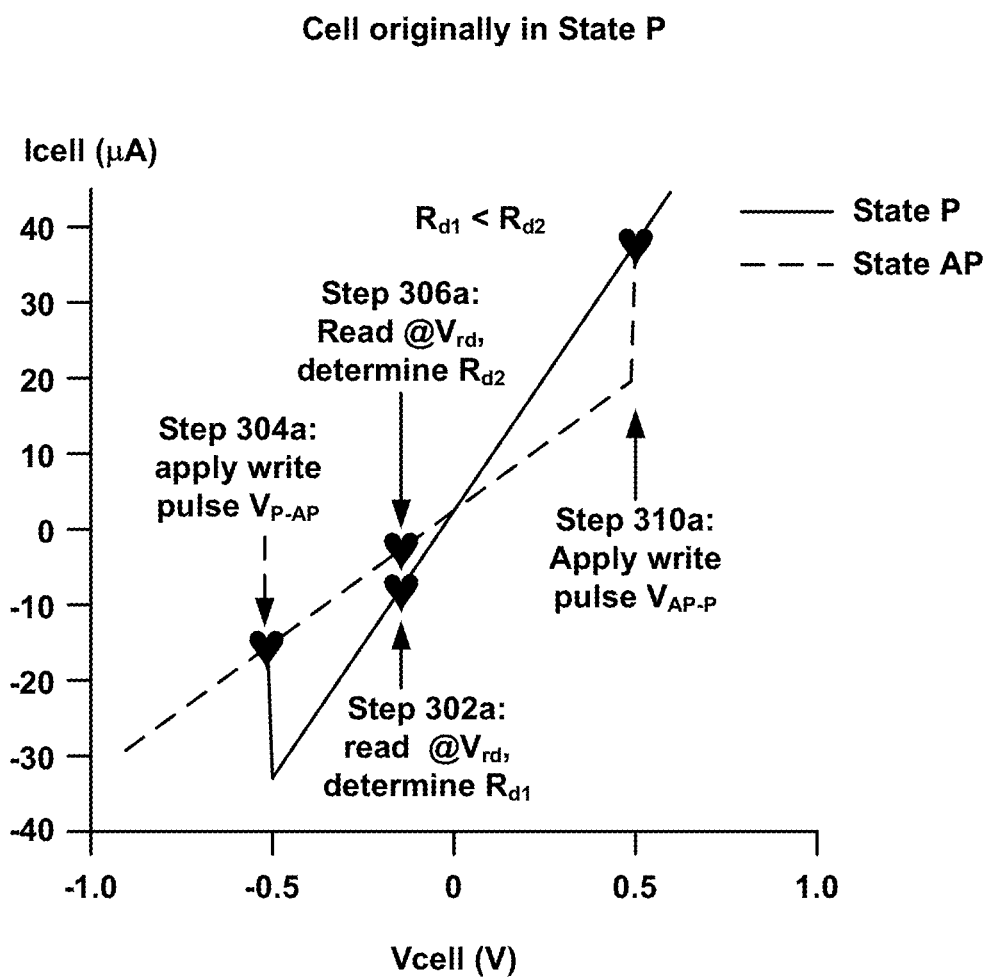
FIG. 3B2

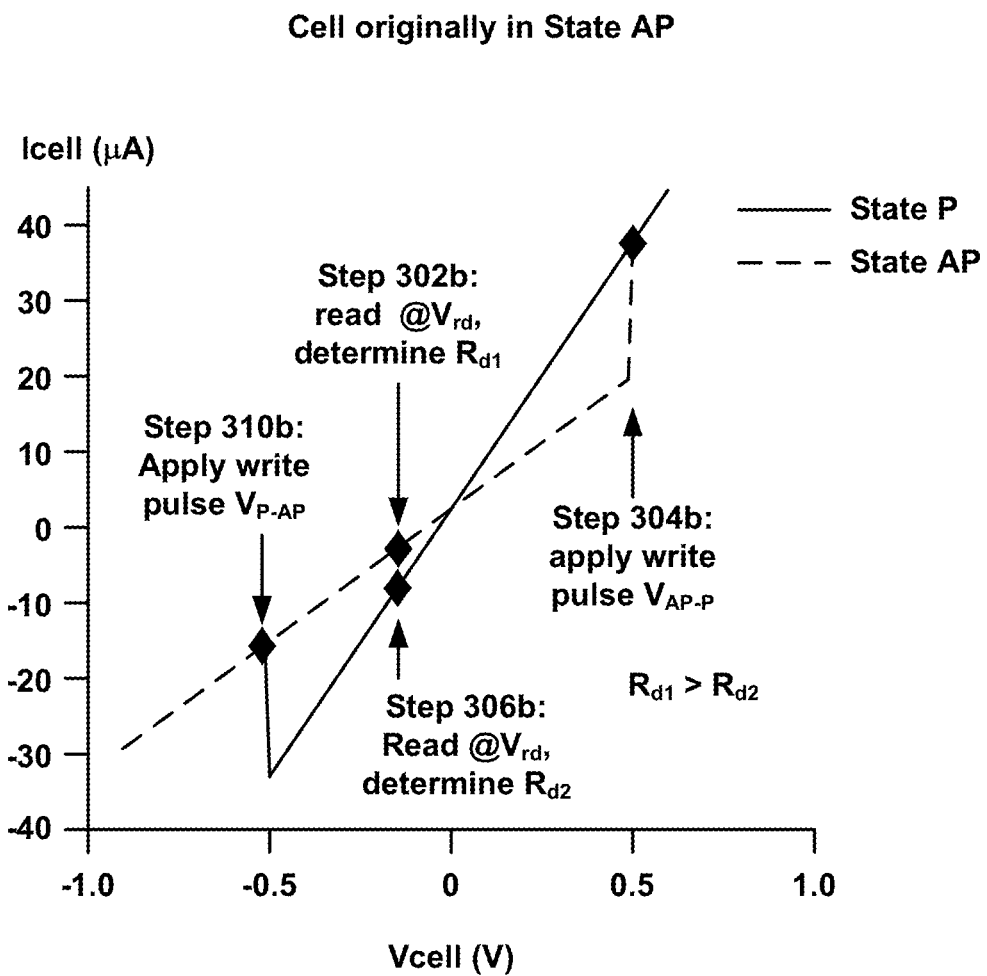
FIG. 3D1

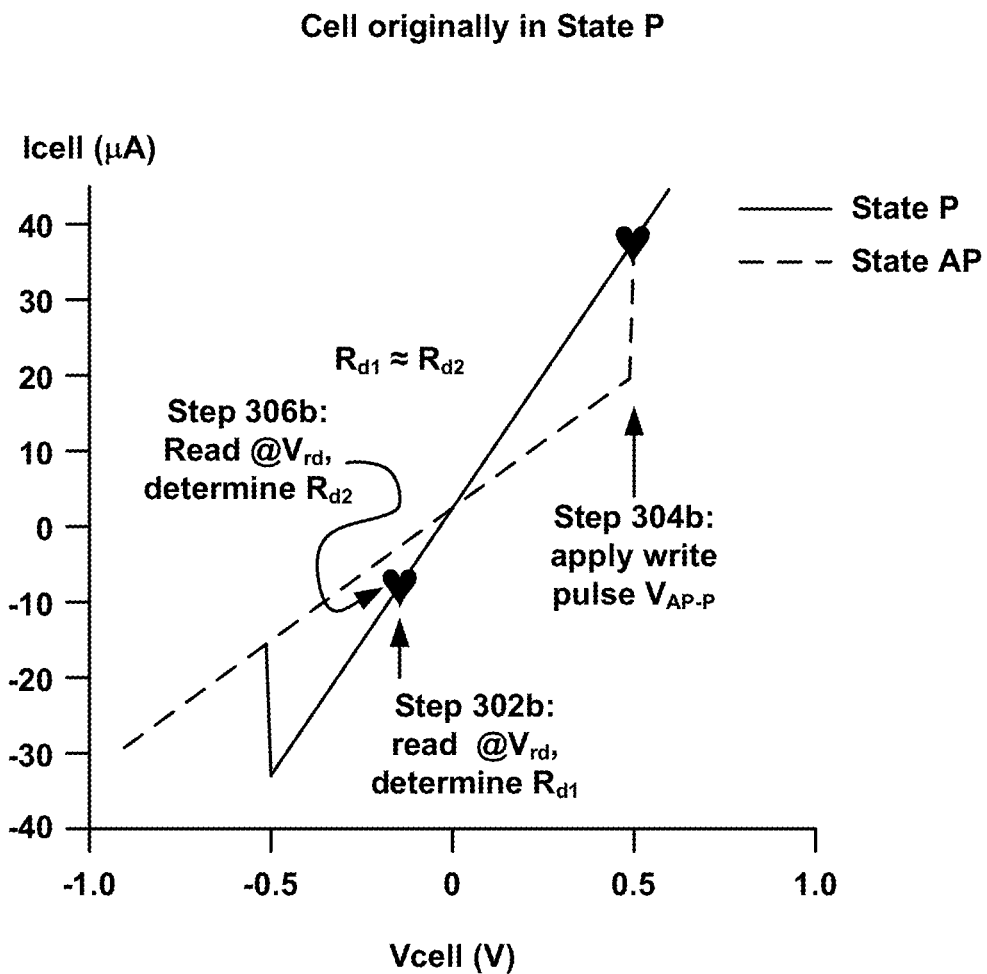
FIG. 3D2

| | AP$_{VHR}$ | AP$_{HR}$ | AP$_{LR}$ | AP$_{VLR}$ | P$_{VHR}$ | P$_{HR}$ | P$_{LR}$ | P$_{VLR}$ |
|---|---|---|---|---|---|---|---|---|
| Initial Cell State | 0 | 0 | 0 | 0 | 1 | 1 | 1 | 1 |
| cell resistance | 6U | 4U | 3U | 2U | 3U | 2U | 1.5U | 1U |
| read current | $I_{r1}$ | $I_{r2}$ | $I_{r3}$ | $I_{r4}$ | $I_{r3}$ | $I_{r4}$ | $I_{r5}$ | $I_{r6}$ |
| Register A: read using $I_0$ | 0 | 0 | 0 | 1 | 0 | 1 | 1 | 1 | populations that cause read errors

|  | AP$_{VHR}$ | AP$_{HR}$ | AP$_{LR}$ | AP$_{VLR}$ | P$_{VHR}$ | P$_{HR}$ | P$_{LR}$ | P$_{VLR}$ |
|---|---|---|---|---|---|---|---|---|
| Initial Cell State | 0 | 0 | 0 | 0 | 1 | 1 | 1 | 1 |
| cell resistance | 6U | 4U | 3U | 2U | 3U | 2U | 1.5U | 1U |
| read current | I$_{r1}$ | I$_{r2}$ | I$_{r3}$ | I$_{r4}$ | I$_{r3}$ | I$_{r4}$ | I$_{r5}$ | I$_{r6}$ |
| Register A: read using I$_0$ | 0 | 0 | 0 | 1 | 0 | 1 | 1 | 1 |
| Register BH: read using I$_{lo}$ | 0 | 0 | 1 | 1 | 1 | 1 | 1 | 1 | populations that cause read errors

| | populations that cause read errors | | | | | | | |
|---|---|---|---|---|---|---|---|---|
| | $AP_{VHR}$ | $AP_{HR}$ | $AP_{LR}$ | $AP_{VLR}$ | $P_{VHR}$ | $P_{HR}$ | $P_{LR}$ | $P_{VLR}$ |
| Initial Cell State | 0 | 0 | 0 | 0 | 1 | 1 | 1 | 1 |
| cell resistance | 6U | 4U | 3U | 2U | 3U | 2U | 1.5U | 1U |
| read current | $I_{r1}$ | $I_{r2}$ | $I_{r3}$ | $I_{r4}$ | $I_{r3}$ | $I_{r4}$ | $I_{r5}$ | $I_{r6}$ |
| Register A: read using $I_0$ | 0 | 0 | 0 | 1 | 0 | 1 | 1 | 1 |
| Register BH: read using $I_{lo}$ | 0 | 0 | 1 | 1 | 1 | 1 | 1 | 1 |
| Register BL: read using $I_{hi}$ | 0 | 0 | 0 | 0 | 0 | 0 | 1 | 1 |

| | $AP_{VHR}$ | $AP_{HR}$ | $AP_{LR}$ | $AP_{VLR}$ | $P_{VHR}$ | $P_{HR}$ | $P_{LR}$ | $P_{VLR}$ |
|---|---|---|---|---|---|---|---|---|
| Write all cells to AP State | 0 | 0 | 0 | 0 | 0 | 0 | 0 | 0 |
| cell resistance | 6U | 4U | 3U | 2U | 6U | 4U | 3U | 2U |
| read current | $I_{r1}$ | $I_{r2}$ | $I_{r3}$ | $I_{r4}$ | $I_{r1}$ | $I_{r2}$ | $I_{r3}$ | $I_{r4}$ |
| Register A: read using $I_0$ | 0 | 0 | 0 | 1 | 0 | 1 | 1 | 1 |
| Register BH: read using $I_{lo}$ | 0 | 0 | 1 | 1 | 1 | 1 | 1 | 1 |
| Register BL: read using $I_{hi}$ | 0 | 0 | 0 | 0 | 0 | 0 | 1 | 1 |
| Register C: read using $I_{lo}$ | 0 | 0 | 1 | 1 | 0 | 0 | 1 | 1 | populations that cause read errors

|  | | | | populations that cause read errors | | | | |
|---|---|---|---|---|---|---|---|---|
|  | $AP_{VHR}$ | $AP_{HR}$ | $AP_{LR}$ | $AP_{VLR}$ | $P_{VHR}$ | $P_{HR}$ | $P_{LR}$ | $P_{VLR}$ |
| Cell State | 0 | 0 | 0 | 0 | 0 | 0 | 0 | 0 |
| cell resistance | 6U | 4U | 3U | 2U | 6U | 4U | 3U | 2U |
| read current | $I_{r1}$ | $I_{r2}$ | $I_{r3}$ | $I_{r4}$ | $I_{r1}$ | $I_{r2}$ | $I_{r3}$ | $I_{r4}$ |
| Register A: read using $I_0$ | 0 | 0 | 0 | 1 | 0 | 1 | 1 | 1 |
| Register BH: read using $I_{lo}$ | 0 | 0 | 1 | 1 | 1 | 1 | 1 | 1 |
| Register BL: read using $I_{hi}$ | 0 | 0 | 0 | 0 | 0 | 0 | 1 | 1 |
| Register C: read using $I_{lo}$ | 0 | 0 | 1 | 1 | 0 | 0 | 1 | 1 |
| Register MH: (A ⊕ BH) | 0 | 0 | 1 | 0 | 1 | 0 | 0 | 0 |
| Register ML: (A ⊕ BL) | 0 | 0 | 0 | 1 | 0 | 1 | 0 | 0 |

| | populations that cause read errors | | | | | | | |
|---|---|---|---|---|---|---|---|---|
| | $AP_{VHR}$ | $AP_{HR}$ | $AP_{LR}$ | $AP_{VLR}$ | $P_{VHR}$ | $P_{HR}$ | $P_{LR}$ | $P_{VLR}$ |
| Cell State | 0 | 0 | 0 | 0 | 0 | 0 | 0 | 0 |
| cell resistance | 6U | 4U | 3U | 2U | 6U | 4U | 3U | 2U |
| read current | $I_{r1}$ | $I_{r2}$ | $I_{r3}$ | $I_{r4}$ | $I_{r1}$ | $I_{r2}$ | $I_{r3}$ | $I_{r4}$ |
| Register A: read using $I_0$ | 0 | 0 | 0 | 1 | 0 | 1 | 1 | 1 |
| Register BH: read using $I_{lo}$ | 0 | 0 | 1 | 1 | 1 | 1 | 1 | 1 |
| Register BL: read using $I_{hi}$ | 0 | 0 | 0 | 0 | 0 | 0 | 1 | 1 |
| Register MH: (A ⊕ BH) | 0 | 0 | 1 | 0 | 1 | 0 | 0 | 0 |
| Register ML: (A ⊕ ML) | 0 | 0 | 0 | 1 | 0 | 1 | 0 | 0 |
| Register C: read using $I_{lo}$ | 0 | 0 | 1 | 1 | 0 | 0 | 1 | 1 |
| Register DH: MH AND $\overline{C}$ | 0 | 0 | 0 | 0 | 1 | 0 | 0 | 0 |
| Register DL: ML AND C | 0 | 0 | 0 | 1 | 0 | 0 | 0 | 0 |
| Register A: (A ⊕ (DH OR DL)) | 0 | 0 | 0 | 0 | 1 | 1 | 1 | 1 |

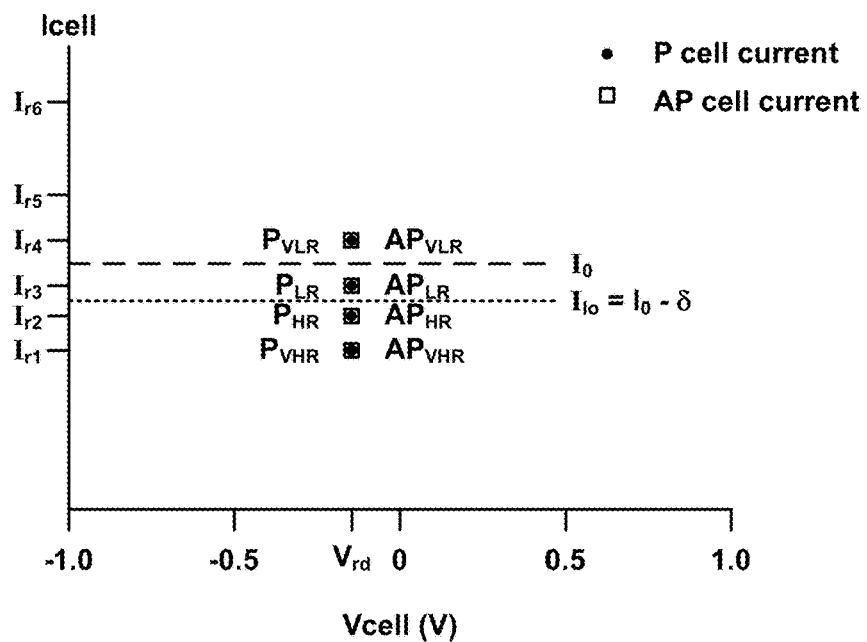

FIG. 6F

OVERWRITE READ METHODS FOR RESISTANCE SWITCHING MEMORY DEVICES

PRIORITY DATA

This application is a continuation of U.S. patent application Ser. No. 16/502,067 filed on Jul. 3, 2019, entitled "OVERWRITE READ METHODS FOR MEMORY DEVICES," which application claims priority to U.S. Provisional Patent Application No. 62/858,402 filed Jun. 7, 2019, entitled "OVERWRITE READ METHODS FOR MEMORY DEVICES," which applications are incorporated herein by reference in their entirety for all purposes.

BACKGROUND

Memory is widely used in various electronic devices such as cellular telephones, digital cameras, personal digital assistants, medical electronics, mobile computing devices, non-mobile computing devices and data servers. Memory may be non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that store data using electronic charge. Generally, MRAM includes a large number of magnetic memory cells formed on a semiconductor substrate, where each memory cell represents one bit of data. A bit of data is written to a memory cell by changing the direction of magnetization of a magnetic element within the memory cell, and a bit is read by measuring the resistance of the memory cell (low resistance typically represents a "0" bit, and high resistance typically represents a "1" bit). As used herein, direction of magnetization is the direction of orientation of the magnetic moment.

Although MRAM is a promising technology, numerous challenges remain.

BRIEF DESCRIPTION OF THE DRAWINGS

Like-numbered elements refer to common components in the different figures.

FIG. 3B1 depicts an example operation of the process of FIG. 3A for an MRAM memory cell initially in anti-parallel state AP.
FIG. 3B2 depicts an example operation of the process of FIG. 3A for an MRAM memory cell initially in parallel state P.
FIG. 3D1 depicts an example operation of the process of FIG. 3C for an MRAM memory cell initially in anti-parallel state AP.
FIG. 3D2 depicts an example operation of the process of FIG. 3C for an MRAM memory cell initially in parallel state P.
FIGS. 6A-6F depict example current-versus voltage characteristics of a population of MRAM memory cells.

DETAILED DESCRIPTION

Figure 1A:
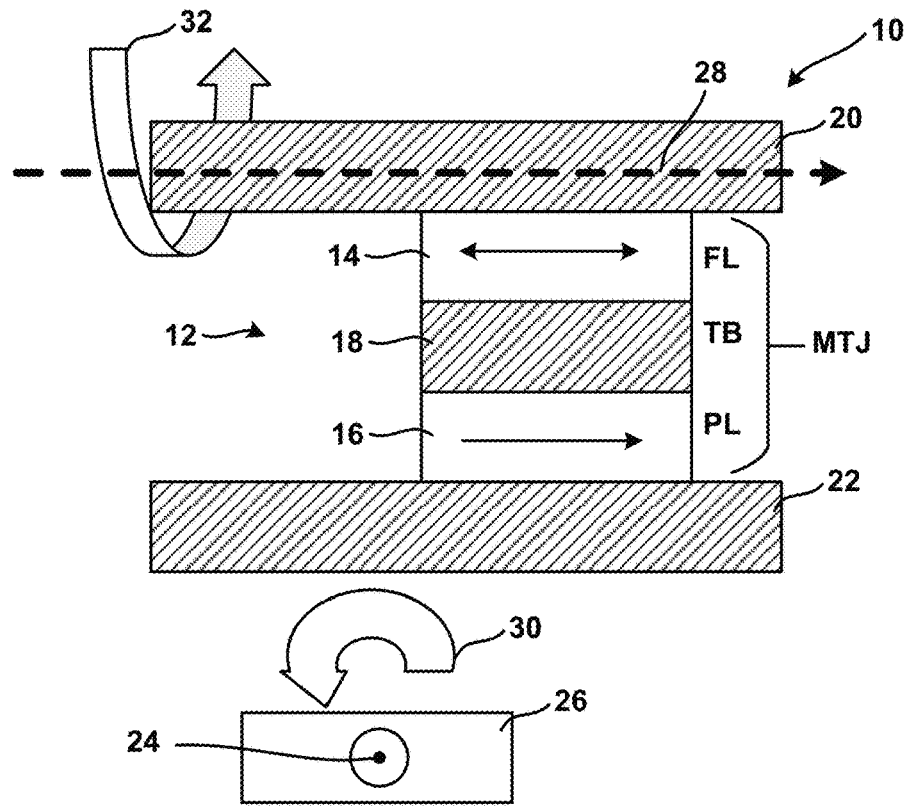
FIG. 1A is a block diagram of a MRAM memory cell.

FIG. 1A is a schematic perspective view of a prior MRAM memory cell 10 that uses field-induced switching. Generally, MRAM memory cell 10 includes a magnetic tunnel junction (MTJ) 12 that includes an upper ferromagnetic layer 14, a lower ferromagnetic layer 16, and a tunnel barrier (TB) 18 which is an insulating layer between the two ferromagnetic layers. In this example, upper ferromagnetic layer 14 is a free layer (FL) that has a direction of magnetization that can be switched. Lower ferromagnetic layer 16 is a pinned (or fixed) layer (PL) that has a direction of magnetization that does not change.

When the direction of magnetization in free layer 14 is parallel to that of pinned layer 16, the resistance ($R_P$) (referred to herein as "parallel resistance $R_P$") across MRAM memory cell 10 is relatively low, due at least in part to spin dependent scattering of minority electrons. When the direction of magnetization in free layer 14 is anti-parallel to that of pinned layer 16, the resistance ($R_{AP}$) (referred to herein as "anti-parallel resistance $R_{AP}$") across MRAM memory cell 10 is relatively high, due at least in part to spin dependent scattering of minority and majority electrons. The data state ("0" or "1") of MRAM memory cell 10 is read by measuring the resistance of MRAM memory cell 10. In this regard, electrical conductors 20/22 attached to MRAM memory cell 10 are utilized to read the MRAM data.

The direction of magnetization in free layer 14 changes in response to current 24 flowing in a digit line 26 and in response to current 28 flowing in a write line 20 that generate magnetic fields 30 and 32 respectively. FIG. 1A depicts the situation in which current 24 in digit line 26 is flowing out of the page, and current 28 in write line 20 is flowing from left to right. As a result, magnetic fields 30 and 32 are orthogonal, which will cause the direction of magnetization in free layer 14 to switch from parallel to anti-parallel relative to that of pinned layer 16. The orientation of a bit is switched by reversing the polarity of current 28 in write line 20 while keeping a constant polarity of current 24 in digit line 26.

The field induced switching technique described above for MRAM memory cell 10 of FIG. 1A has some practical limitations, particularly when the design calls for scaling the MRAM memory cell to smaller dimensions. For example, because this technique requires two sets of magnetic field write lines, the array of MRAM memory cells is susceptible to bit disturbs (i.e., neighboring cells may be unintentionally altered in response to the write current directed to a given cell).

Furthermore, decreasing the physical size of the MRAM memory cells results in lower magnetic stability against magnetization switching due to thermal fluctuations. The stability of the bit can be enhanced by utilizing a magnetic material for the free layer with a large magnetic anisotropy and therefore a large switching field, but then the currents required to generate a magnetic field strong enough to switch the bit are impractical in existing applications.

Figure 1B:
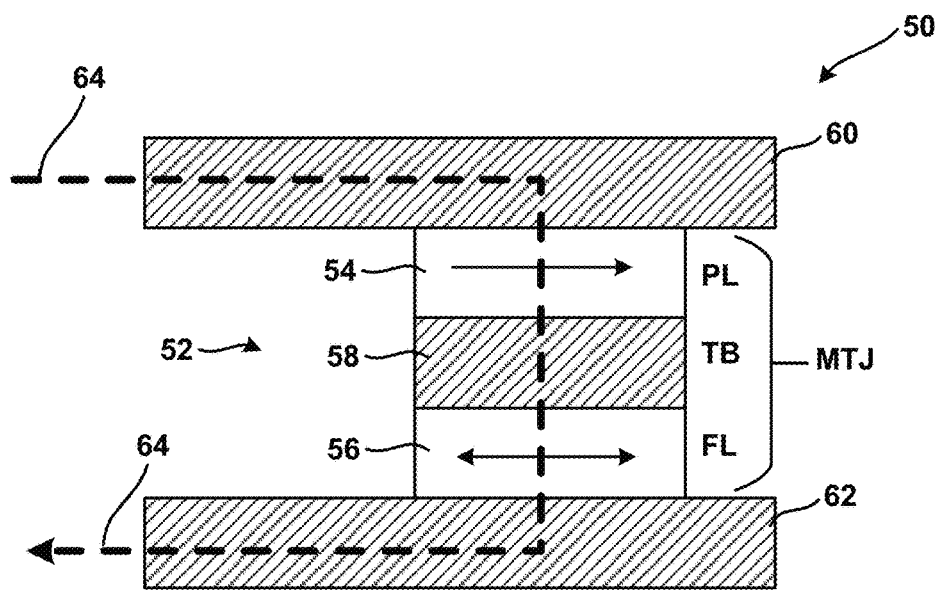
FIG. 1B is a block diagram of a MRAM memory cell.

Spin-transfer-torque (STT) switching is another technique for programming MRAM memory cells. FIG. 1B is a schematic representation of an STT-switching technique for an MRAM memory cell 50 that includes a magnetic tunnel junction 52 that includes an upper ferromagnetic layer 54, a lower ferromagnetic layer 56, and a tunnel barrier 58 which is an insulating layer between the two ferromagnetic layers. In this example, lower ferromagnetic layer 56 is the free layer that has a direction of magnetization that can be switched. Upper ferromagnetic layer 54 is the pinned (or fixed) layer that has a direction of magnetization that is not easily changed.

When the direction of magnetization in free layer 56 is parallel to that of pinned layer 54, the parallel resistance $R_P$ across MRAM memory cell 50 is relatively low. When the direction of magnetization in free layer 56 is anti-parallel to that of pinned layer 54, the anti-parallel resistance $R_{AP}$ across MRAM memory cell 50 is relatively high. The data state ("0" or "1") of memory cell 50 is read by measuring the resistance of MRAM memory cell 50. In this regard, electrical conductors 60/62 attached to MRAM memory cell 50 are utilized to read the MRAM data. By design, both the parallel and anti-parallel configurations remain stable in the quiescent state and/or during a read operation (at sufficiently low read current).

In the remaining text and figures, direction of the write current is defined as the direction of the electron flow. Therefore, the term write current refers to an electron current.

To "set" the MRAM memory cell bit value (i.e., choose the direction of the free layer magnetization), an electrical write current 64 is applied from conductor 60 to conductor 62. The electrons in write current 64 become spin-polarized as they pass through pinned layer 54 because pinned layer 54 is a ferromagnetic metal. Although conduction electrons in a ferromagnetic metal will have spin orientation collinear with the direction of magnetization, a substantial majority of them will have a particular orientation that is parallel to the direction of magnetization, yielding a net spin polarized current. (Electron spin refers to angular momentum, which is directly proportional to but anti-parallel in direction to the magnetic moment of the electron, but this directional distinction will not be used going forward for ease of discussion.)

When the spin-polarized electrons tunnel across tunnel barrier 58, conservation of angular momentum can result in the imparting of a torque on both free layer 56 and pinned layer 54, but this torque is inadequate (by design) to affect the direction of magnetization of pinned layer 54. Contrastingly, this torque is (by design) sufficient to switch the direction of magnetization of free layer 56 to become parallel to that of pinned layer 54 if the initial direction of magnetization of free layer 56 was anti-parallel to pinned layer 54. The parallel magnetizations will then remain stable before and after such write current is turned OFF.

In contrast, if free layer 56 and pinned layer 54 magnetizations are initially parallel, the direction of magnetization of free layer 56 can be STT-switched to become anti-parallel to that of pinned layer 54 by application of a write current of opposite direction to the aforementioned case. Thus, by way of the same STT physics, the direction of the magnetization of free-layer 56 can be deterministically set into either of two stable orientations by judicious choice of the write current direction (polarity).

Figure 1C:
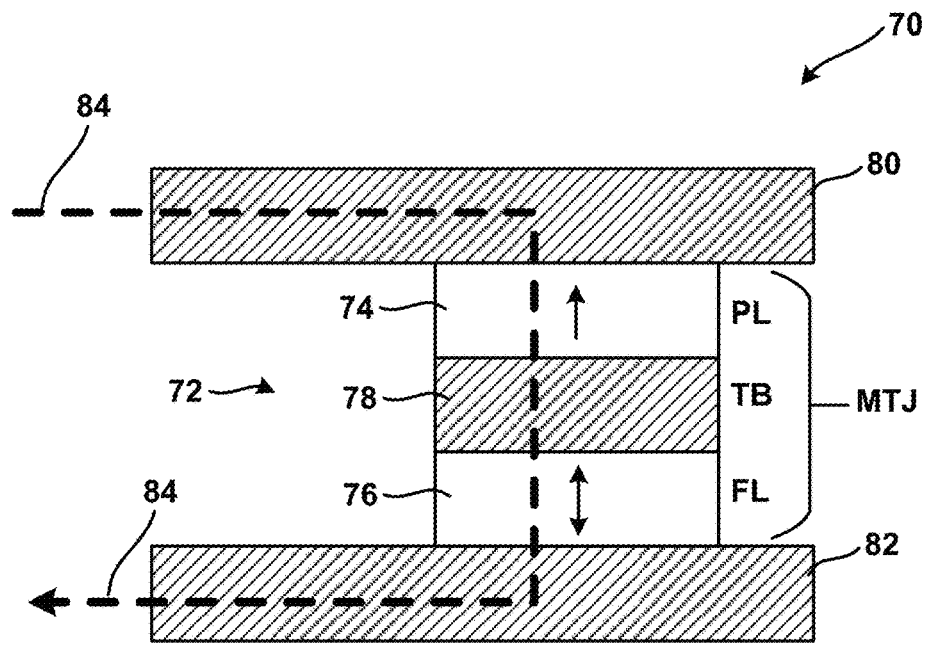
FIG. 1C is a block diagram of a MRAM memory cell.

MRAM memory cell 50 of FIG. 1B uses materials in which both the pinned and free-layer magnetization are in the in-plane direction. In contrast, FIG. 1C depicts a schematic representation of a STT-switching MRAM memory cell 70 in which both the pinned and free-layer magnetization are in the perpendicular direction. MRAM memory cell 70 includes a magnetic tunnel junction 72 that includes an upper ferromagnetic layer 74, a lower ferromagnetic layer 76, and a tunnel barrier 78 which is an insulating layer between the two ferromagnetic layers. In this example, lower ferromagnetic layer 76 is the free layer that has a direction of magnetization that can be switched. Upper ferromagnetic layer 74 is the pinned (or fixed) layer and that has a direction of magnetization that is not easily changed.

When the direction of magnetization in free layer 76 is parallel to that of pinned layer 74, the resistance $R_P$ across MRAM memory cell 70 is relatively low. When the direction of magnetization in free layer 76 is anti-parallel to that of pinned layer 74, the resistance $R_{AP}$ across MRAM memory cell 70 is relatively high. The data state ("0" or "1") of MRAM memory cell 70 is read by measuring the resistance of MRAM memory cell 70. In this regard, electrical conductors 80/82 attached to MRAM memory cell 70 are utilized to read the MRAM data. By design, both the parallel and anti-parallel configurations remain stable in the quiescent state and/or during a read operation (at sufficiently low read current). To "set" the MRAM memory cell bit value (i.e., choose the direction of the free layer magnetization), an electrical write current 84 is applied from conductor 80 to conductor 82 and MRAM memory cell 70 operates as discussed above with respect to FIG. 1B.

Compared to the earliest MRAM memory cells which used magnetic fields from current carrying conductors proximate to the MRAM memory cell, the STT switching technique requires relatively low power, virtually eliminates the problem of adjacent bit disturbs, and has more favorable scaling for higher cell densities (reduced MRAM memory cell size). The latter issue also favors STT-MRAM where the free and pinned layer magnetizations are orientated perpendicular to the film plane, rather than in-plane. In practice, however, STT switching requires that the full write current flow through the tunnel barrier, which negatively affects long term reliability of the STT MRAM memory cell due to the necessary stress of moderate to high write voltages across the tunnel barrier.

Figure 1D:
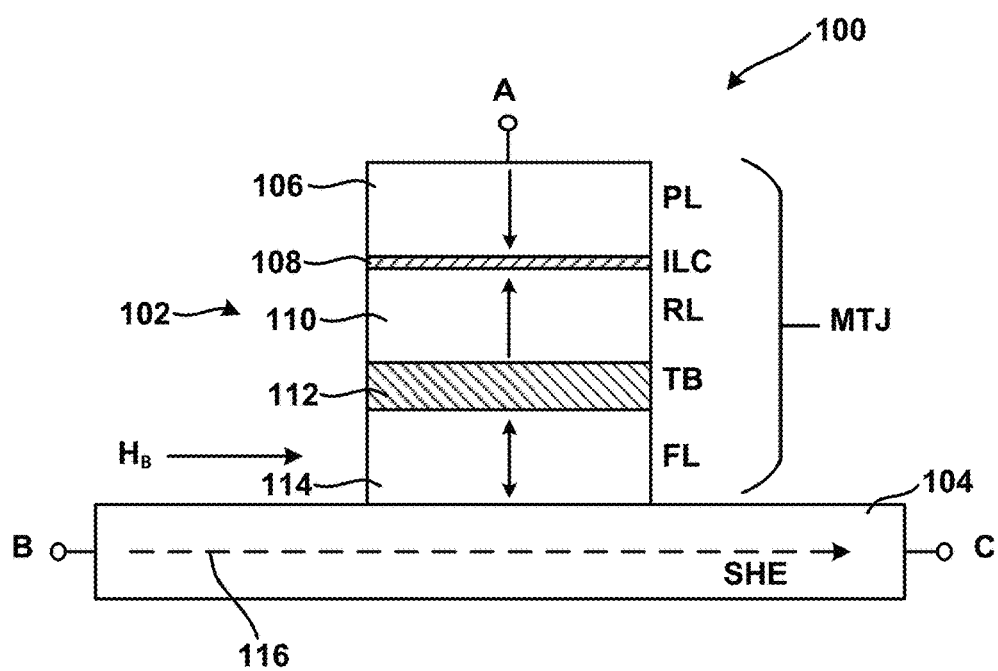
FIG. 1D is a block diagram of a MRAM memory cell.

FIG. 1D depicts an alternative MRAM memory cell 100 that makes use of spin orbit torque (SOT) for switching the free layer using spin current. The spin of an electron is an intrinsic angular momentum, which is separate from the angular momentum due to orbital motion of the electron. In a solid, the spins of many electrons can act together to affect the magnetic and electronic properties of a material, for example endowing it with a permanent magnetic moment as in a ferromagnet.

In many materials, electron spins are equally present in both the up and the down directions, and no transport properties are dependent on spin. However, various techniques can be used to generate a spin-polarized population of electrons, resulting in an excess of spin up or spin down electrons, to change the properties of a material. This spin-polarized population of electrons moving in a common direction through a common material is referred to as a spin current. As described herein, a spin current can be used to operate an MRAM memory cell.

In general, Spin Hall Effect (SHE) may be used to generate spin current flowing in a transverse (perpendicular to plane) direction when applying a charge current flow in a longitudinal (in-plane) direction. The spin polarization direction of such a Spin Hall Effect-generated spin current is in the in-plane direction orthogonal to the charge current flow. MRAM memory cell 100 includes three terminals A, B and C, magnetic tunnel junction 102 and SHE material 120.

In one implementation, magnetic tunnel junction 102 includes a free layer, a tunnel barrier and a pined layer. In another implementation, magnetic tunnel junction 102 includes pinned layer 106, inter-layer coupling (ILC) layer 108, reference layer (RL) 110, tunnel barrier 112 and free layer 114. The inter-layer coupling layer 108 promotes a strong antiferromagnetic (i.e., anti-parallel) coupling between pinned layer 106 and reference layer 110, such that their net magnetic moment mostly cancels, thus greatly reducing unwanted stray field on the free layer. Spin Hall Effect layer 104 includes a heavy metal, such as platinum, tantalum or tungsten, that has strong SHE. The direction of magnetization of free layer 114 is switched between up and down.

An advantage of the SOT-switching design that exploits the Spin Hall Effect is that the write current 116 passes solely through Spin Hall Effect layer 104, and does not flow through tunnel barrier 112. This eliminates the aforementioned long-term degradation of tunnel barrier 112 by the switching current in the prior STT switching design for MRAM memory cells.

Figure 1E:
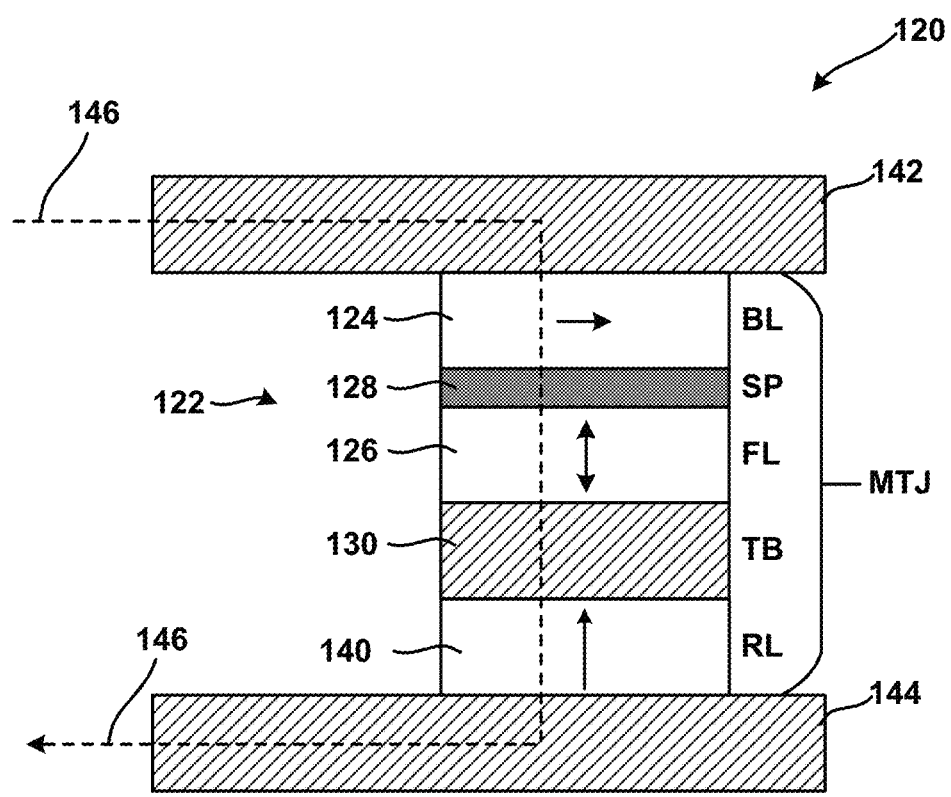
FIG. 1E is a block diagram of a MRAM memory cell.

FIG. 1E depicts a schematic representation of a voltage control of magnetic anisotropy (VCMA) MRAM memory cell 120. VCMA memory cell 120 is similar in structure to STT-switching MRAM memory cell 70 of FIG. 1C, with a few differences. MRAM memory cell 120 includes a magnetic tunnel junction 122 that includes an upper ferromagnetic layer 124, a lower ferromagnetic layer 126, a spacer layer (SP) 128, a tunnel barrier 138, and a reference layer 140. Upper ferromagnetic layer 124 is also referred to as bias layer 124, and lower ferromagnetic layer 126 is also referred to as free layer 126.

When the direction of magnetization in free layer 126 is parallel to that of reference layer 140, the resistance $R_P$ across MRAM memory cell 120 is relatively low. When the direction of magnetization in free layer 126 is anti-parallel to that of reference layer 140, the resistance $R_{AP}$ across MRAM memory cell 120 is relatively high. The data state ("0" or "1") of MRAM memory cell 120 is read by measuring the resistance of MRAM memory cell 120. In this regard, electrical conductors 142/144 attached to MRAM memory cell 120 are utilized to read the MRAM data. The read process is the same as that of MRAM memory cell 70 of FIG. 1C, except the read polarity is chosen to be opposite the write polarity.

In an embodiment, write process of MRAM memory cell 120 is as follows: (1) MRAM memory cell 120 is read to determine its state, (2) if MRAM memory cell 120 is in the desired write state then the write process is terminated, (3) otherwise, a write voltage is applied to MRAM memory cell 120 in the polarity that reduces the magnetic anisotropy of the free layer to nearly zero (the free layer will precess around the magnetic field direction defined by the magnetic bias layer 124 while the write voltage is applied), (4) the write voltage is removed after ½ a precession cycle, and (5) steps 1-4 are repeated until the state is correctly written or the write process times out.

In embodiments, the materials and interfaces of free layer 126, spacer layer 128, and tunnel barrier 130 are chosen to provide a large VCMA coefficient for FL 126 to maximize how much the free layer magnetic anisotropy changes with applied voltage. This can necessitate using materials that increase the resistance of tunnel barrier 130. To achieve reliable switching, free layer 126 typically requires a small non-zero in-plane bias field. In an embodiment, the bias field is generated by bias layer 124. Alternatively, the in-plane field can be supplied by a magnet that is external to MRAM memory cell 120, or by an Oersted field generated by passing current through a wire close to the memory cell.

Figure 2A:
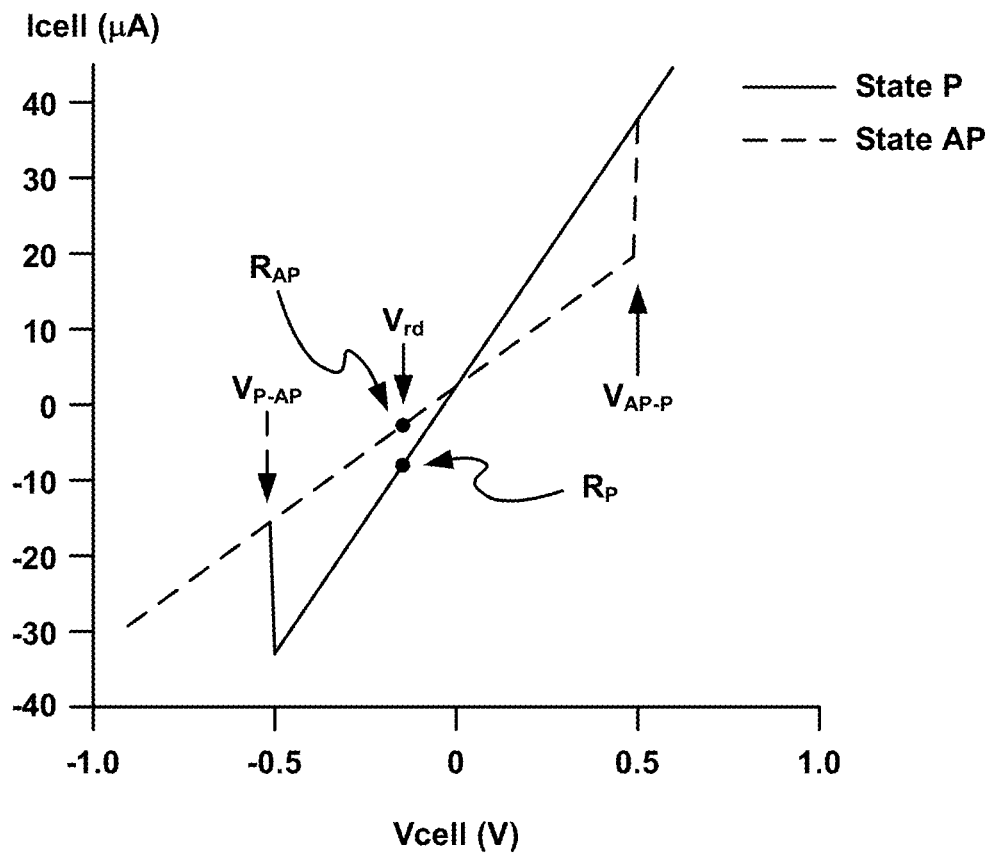
FIG. 2A depicts an example current-versus voltage characteristic of an MRAM memory cell.

FIG. 2A depicts example current-versus voltage characteristic of an MRAM memory cell, such as MRAM memory cells 10, 50, 70 and 100 of FIGS. 1A-1D, respectively. For simplicity, the discussion of FIG. 2A will reference MRAM memory cell 50 of FIG. 1B. In an embodiment, MRAM memory cell 50 may be reversibly switched between a "parallel state" (P) (depicted using a solid line in FIG. 2A) and an "anti-parallel state" (AP) (depicted using a dashed line in FIG. 2A). In parallel state P, the direction of magnetization in free layer 56 is parallel to that of pinned layer 54. In anti-parallel state AP, the direction of magnetization in free layer 56 is anti-parallel to that of pinned layer 54.

If MRAM memory cell 50 is initially in anti-parallel state AP, and an electron electrical write current 64 is applied from conductor 60 to conductor 62, MRAM memory cell 50 will switch to parallel state P. In the embodiment depicted in FIG. 2A, MRAM memory cell 50 switches from anti-parallel state AP to parallel state P at a write voltage $V_{AP-P}$ of about +0.5V between conductor 62 and conductor 60.

Conversely, If MRAM memory cell 50 is initially in parallel state P, and an electron electrical write current 64 is applied from conductor 62 to conductor 60, MRAM memory cell 50 will switch to anti-parallel state AP. In the embodiment depicted in FIG. 2A, MRAM memory cell 50 switches from parallel state P to anti-parallel state AP at a write voltage $V_{P-AP}$ of about −0.5V between conductor 62 and conductor 60.

The state of an MRAM memory cell, such as MRAM memory cell 50 of FIG. 1B, may be determined by applying a read voltage $V_{rd}$ across the MRAM memory cell (e.g., between conductor 60 to conductor 62 of MRAM memory cell 50), and detecting a resistance of the MRAM memory cell. In the embodiment depicted in FIG. 2A, at a read voltage $V_{rd}$ of about −0.16V, MRAM memory cell 50 has an anti-parallel resistance $R_{AP}$ in anti-parallel state AP, and has a parallel resistance $R_P$ in parallel state P.

For example, for an individual MRAM memory cell, anti-parallel resistance $R_{AP}$ may be about 30KΩ, and parallel resistance $R_P$ may be 15KΩ. Thus, the state of the individual MRAM memory cell may be determined by detecting the resistance of the MRAM memory cell at read voltage $V_{rd}$, and then comparing the detected resistance to a threshold resistance value $R_T$ (e.g., $R_T$=22.5 KΩ). If the detected resistance of the MRAM memory cell is greater than threshold resistance value $R_T$, the MRAM memory cell is determined to be in anti-parallel state AP, and if the detected resistance of the MRAM memory cell is less than threshold resistance value $R_T$, the MRAM memory cell is determined to be in parallel state P.

This read technique is effective for reading an individual MRAM memory cell, because the anti-parallel resistance $R_{AP}$ value and parallel resistance $R_P$ value for an individual MRAM memory cell remain relatively constant. However, a group of MRAM memory cells (e.g., in a memory array of MRAM memory cells) often exhibits wide variation in the anti-parallel resistance $R_{AP}$ values and parallel resistance $R_P$ values between MRAM memory cells. Indeed, diameter variations in a population of MRAM memory cells can cause the high resistance state of wider MRAM memory cells to be lower than the low resistance states of narrower MRAM memory cells.

Figure 2B:
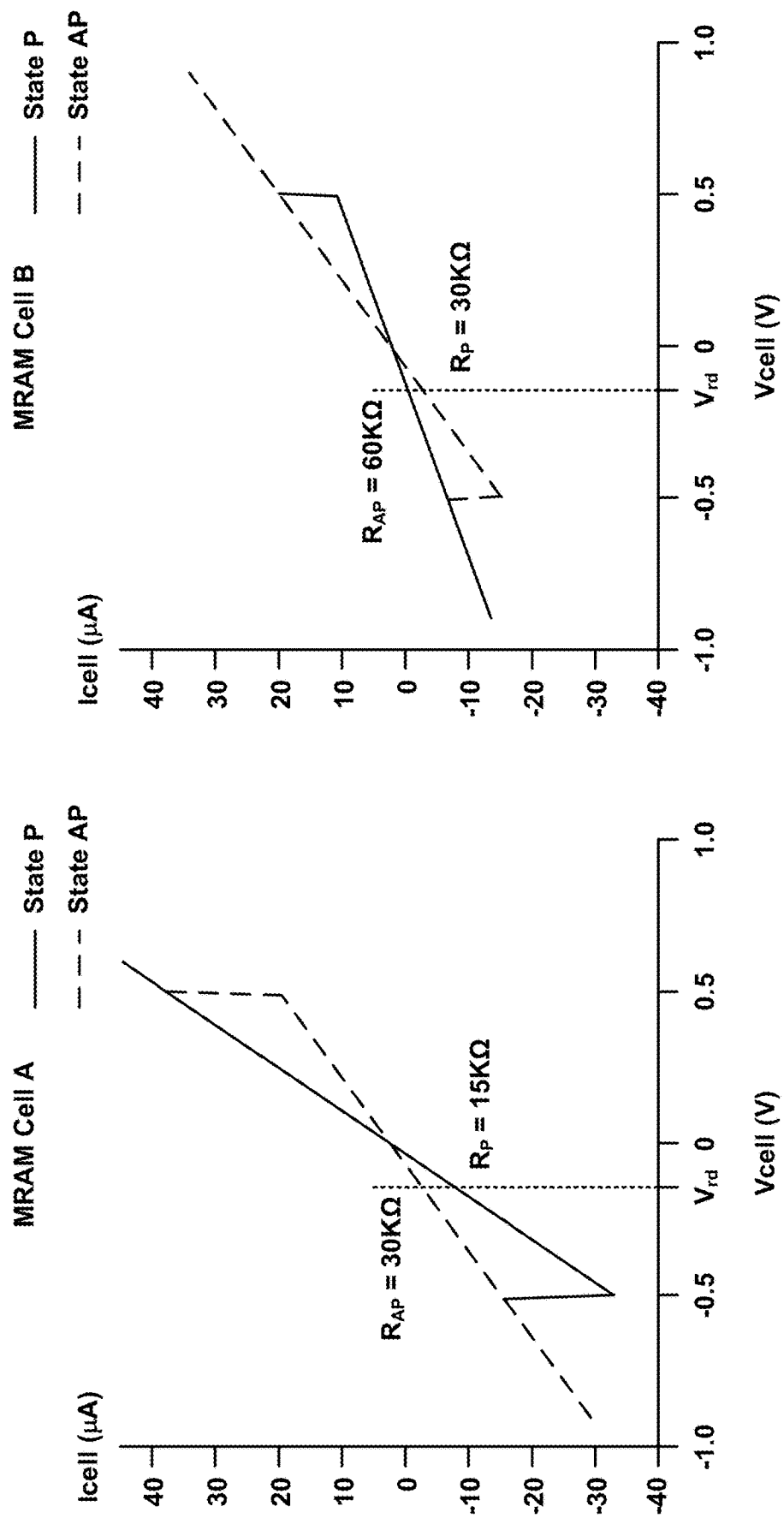
FIG. 2B depicts example current-versus voltage characteristics of MRAM memory cells of an array of MRAM memory cells.

For example, FIG. 2B depicts example current-versus voltage characteristics of a first MRAM memory cell A and a second MRAM memory cell B of an array of MRAM memory cells. MRAM memory cell A has an anti-parallel resistance $R_{AP}$ of 30KΩ, and a parallel resistance $R_P$ of 15 KΩ. MRAM memory cell B has an anti-parallel resistance $R_{AP}$ of 60KΩ, and a parallel resistance $R_P$ of 30 KΩ. If a threshold resistance value $R_T$=22.5KΩ were used for both MRAM memory cells to distinguish between anti-parallel state AP and parallel state P, the state of MRAM memory cell A can be correctly determined, but the state of MRAM memory cell B cannot be correctly determined. Indeed, because the anti-parallel resistance $R_{AP}$ and parallel resistance $R_P$ of MRAM memory cell B are both greater than $R_T$=22.5 KΩ, the state of MRAM memory cell B would always read as anti-parallel state AP regardless of the actual state of MRAM memory cell B.

In contrast, if a threshold resistance value $R_T$=45KΩ were used for both MRAM memory cells to distinguish between anti-parallel state AP and parallel state P, the state of MRAM memory cell B can be correctly determined, but the state of MRAM memory cell A cannot be correctly determined. Indeed, because the anti-parallel resistance $R_{AP}$ and parallel resistance $R_P$ of MRAM memory cell A are both less than $R_T$=45 KΩ, the state of MRAM memory cell A would always read as parallel state P regardless of the actual state of MRAM memory cell B.

In addition to variations in resistance between MRAM memory cells, other circuit element variations also can cause read errors. For example, in an array of MRAM memory cells, a select device (e.g., a transistor or threshold switch) often is coupled in series with an MRAM memory cell so that individual MRAM memory cells may be selected for reading and writing. Variations in select device properties, such as on-resistance and offset voltage, also lead to read errors. Moreover, MRAM memory cell property distributions will likely increase with decreasing critical dimension, thus limiting achievable MRAM die capacity. MRAM memory cell area distributions, for example, are tied to lithography tolerances, which will not necessarily scale as dimensions decrease.

To overcome these deficiencies, a new method is proposed for reading MRAM memory cells. In particular, rather that determining MRAM memory cell state by measuring device resistance alone, the proposed reading scheme measures a change in device resistance in response to a write pulse to determine MRAM memory cell state. The new MRAM read method is referred to herein as an "overwrite-read process."

Figure 3A:
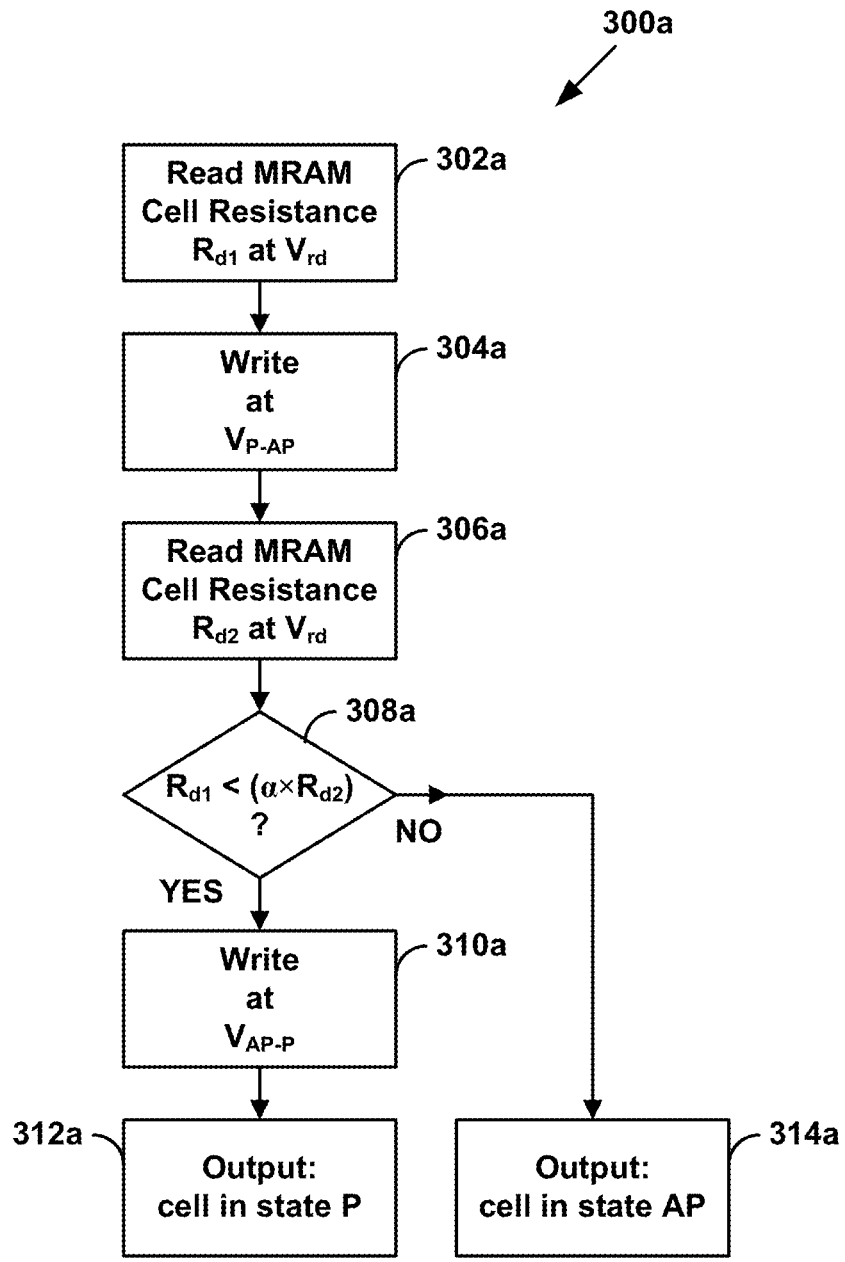
FIG. 3A is a flow chart of an embodiment of a process for reading an MRAM memory cell.

FIG. 3A is a flow chart of an embodiment of an overwrite-read process 300a for reading an MRAM memory cell (e.g., any of MRAM memory cells 10, 50, 70 and 100 of FIGS. 1A-1D, respectively), and FIGS. 3B1-3B2 depict example current-versus voltage characteristics of an MRAM memory cell to facilitate an understanding of process 300a. In particular, FIG. 3B1 depicts an example operation of overwrite-read process 300a for an MRAM memory cell initially in anti-parallel state AP, and FIG. 3B2 depicts an example operation of overwrite-read process 300a for an MRAM memory cell initially in parallel state P.

Referring again to FIG. 3A, at step 302a a read voltage $V_{rd}$ is applied across the MRAM memory cell and a first resistance $R_{d1}$ of the MRAM memory cell is determined. In an embodiment, read voltage $V_{rd}$ is about –0.16V, although other read voltages may be used. In the example illustrated in FIG. 3B1, the MRAM memory cell is initially in anti-parallel state AP, and first resistance $R_{d1}$ is determined at read voltage $V_{rd}$ on the "State AP" line. In the example illustrated in FIG. 3B2, the MRAM memory cell is initially in parallel state P, and first resistance $R_{d1}$ is determined at read voltage $V_{rd}$ on the "State P" line.

Referring again to FIG. 3A, at step 304a a write voltage $V_{P-AP}$ is applied across the MRAM memory cell. In an embodiment, write voltage $V_{P-AP}$ is about –0.5V, although other write voltages $V_{P-AP}$ may be used. If the MRAM memory cell originally was in parallel state P prior to application of write voltage $V_{P-AP}$, the MRAM memory cell will switch to anti-parallel state AP as a result of the write operation. If, however, the MRAM memory cell was in anti-parallel state AP prior to application of write voltage $V_{P-AP}$, the MRAM memory cell will remain in anti-parallel state AP (i.e., no switching will occur).

In the example illustrated in FIG. 3B1, the MRAM memory cell is initially in anti-parallel state AP, and the MRAM memory cell will remain in anti-parallel state AP on the "State AP" line. In the example illustrated in FIG. 3B2, the MRAM memory cell is initially in parallel state P, and the MRAM memory cell will switch to anti-parallel state AP on the "State AP" line.

Referring again to FIG. 3A, at step 306a a read voltage $V_{rd}$ is applied across the MRAM memory cell and a second resistance $R_{d2}$ of the MRAM memory cell is determined. In an embodiment, read voltage $V_{rd}$ is the same voltage used at step 302a (e.g., about –0.16V). In the example illustrated in FIG. 3B1, the MRAM memory cell is still in anti-parallel state AP, and second resistance $R_{d2}$ is determined at read voltage $V_{rd}$ on the "State AP" line. In the example illustrated in FIG. 3B2, the MRAM memory cell is in anti-parallel state AP, and second resistance $R_{d2}$ is determined at read voltage $V_{rd}$ on the "State AP" line.

Referring again to FIG. 3A, at step 308a a determination is made whether first resistance $R_{d1}$ is less than second resistance $R_{d2}$. Step 308a is used to determine if the MRAM memory cell changed state as a result of write voltage $V_{P-AP}$ applied at step 304a. In particular, if the MRAM memory cell was originally in parallel state P prior to application of write voltage $V_{P-AP}$, and switched to anti-parallel state AP as a result of the write operation, first resistance $R_{d1}$ will be less than second resistance $R_{d2}$.

If, however, if the MRAM memory cell was originally in anti-parallel state AP prior to application of write voltage $V_{P-AP}$, and remains in anti-parallel state AP following the write operation, first resistance $R_{d1}$ will be substantially equal to second resistance $R_{d2}$. To avoid errors resulting from slight variations in first resistance $R_{d1}$ and second resistance $R_{d2}$ in this scenario (e.g., $R_{d1}$=45.0 KΩ and $R_{d2}$=45.8 KΩ) a scalar multiplier α may be used in step 308a:

$$R_{d1} < (\alpha \times R_{d2}) \quad (1)$$

where α may be between about 0.5-1, although other values may be used. Table 1, below, shows example values for $R_{d1}$, $R_{d2}$, and ($\alpha \times R_{d2}$), with $\alpha = 2/3$:

TABLE 1

| MRAM Cell Initial State | $R_{d1}$ | $R_{d2}$ | $\alpha \times R_{d2}$ | $R_{d1} < (\alpha \times R_{d2})$ ? |
|---|---|---|---|---|
| P | 15 KΩ | 45 KΩ | 30 KΩ | YES |
| AP | 45 KΩ | 45 KΩ | 30 KΩ | NO |

Referring again to FIG. 3A, if at step 308a a determination is made that first resistance $R_{d1}$ is less than α times second resistance $R_{d2}$, the MRAM memory cell originally was in parallel state P prior to application of write voltage $V_{P-AP}$ at step 304a, and thus switched to anti-parallel state AP as a result of the write operation. At step 310a a write voltage $V_{AP-P}$ is applied across the MRAM memory cell to return the MRAM memory cell to parallel state P. In the example illustrated in FIG. 3B2, following application of write voltage $V_{AP-P}$, the MRAM memory switches from anti-parallel state AP to parallel state P. At step 312a, overwrite-read process 300a outputs the read result: the MRAM memory cell is in parallel state P.

Referring again to FIG. 3A, if however at step 308a a determination is made that first resistance $R_{d1}$ is not less than α times second resistance $R_{d2}$, the MRAM memory cell originally was in anti-parallel state AP prior to application of write voltage $V_{P-AP}$ at step 304a, and remained in anti-parallel state AP. Thus, at step 314a, overwrite-read process 300a outputs the read result: the MRAM memory cell is in anti-parallel state AP.

Persons of ordinary skill in the art will understand that alternative criteria may be used at step 308a to determine the state of the MRAM memory cell. For example, in an alternative embodiment, at step 308a a determination may be made whether the absolute value of the difference between first resistance $R_{d1}$ and second resistance $R_{d2}$ is greater than Δ times first resistance $R_{d1}$:

$$|R_{d1} - R_{d2}| > (\Delta \times R_{d1}) \quad (2)$$

where Δ is a scalar value that may be between about 1-2, although other values may be used. Table 2, below, shows example values for $R_{d1}$, $R_{d2}$, and ($\Delta \times R_{d1}$), with Δ=1.5:

TABLE 2

| MRAM Cell Initial State | $R_{d1}$ | $R_{d2}$ | $|R_{d1} - R_{d2}|$ | $\Delta \times R_{d1}$ | $|R_{d1} - R_{d2}| > (\Delta \times R_{d1})$? |
|---|---|---|---|---|---|
| P | 15 KΩ | 45 KΩ | 30 KΩ | 22.5 KΩ | YES |
| AP | 45 KΩ | 45 KΩ | 0 | 67.5 KΩ | NO |

Thus, the determination of Equation (2), above, alternatively may be used instead of the determination of Equation (1), above, at step 308a to achieve the same result.

Without wanting to be bound by any particular theory, it is believed that the example overwrite-read process 300a of FIG. 3A may achieve a lower read error rate at lower process tolerances. In particular, without wanting to be bound by any particular theory, it is believed that example overwrite-read process 300a of FIG. 3A may not be sensitive to critical dimension variations from device to device, and may enable larger processes tolerances and hence higher storage densities. In particular, without wanting to be bound by any particular theory, it is believed that example overwrite-read process 300a of FIG. 3A may not be sensitive to variations from cell to cell in wire resistance, offset voltage for access device, and temperature drifts of these parameters.

Figure 3C:
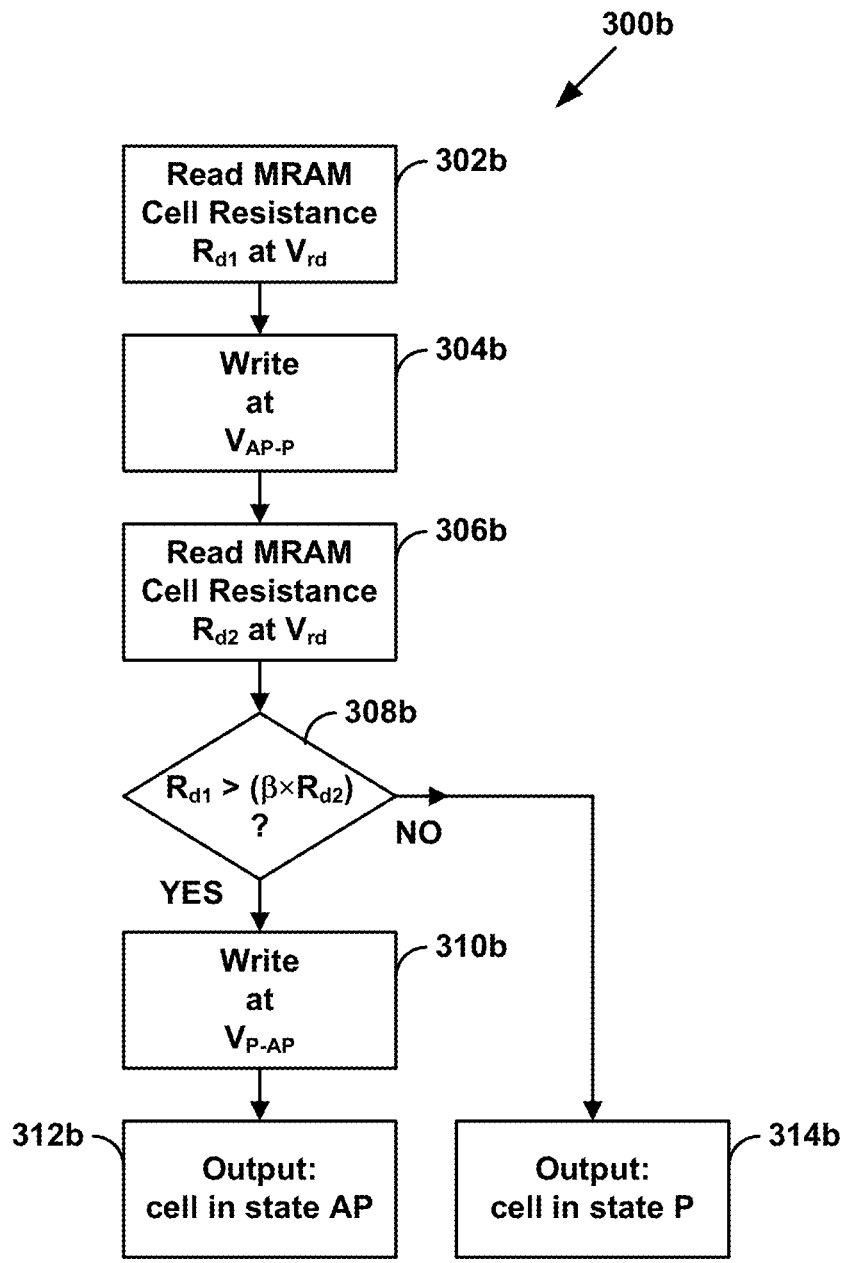
FIG. 3C is a flow chart of another embodiment of a process for reading an MRAM memory cell.

FIG. 3C is a flow chart of an embodiment of another overwrite-read process 300b for reading an MRAM memory cell (e.g., any of MRAM memory cells 10, 50, 70 and 100 of FIGS. 1A-1D, respectively), and FIGS. 3D1-3D2 depict example current-versus voltage characteristics of an MRAM memory cell to facilitate an understanding of overwrite-read process 300b. In particular, FIG. 3D1 depicts an example operation of overwrite-read process 300b for an MRAM memory cell initially in anti-parallel state AP, and FIG. 3D2 depicts an example operation of overwrite-read process 300ba for an MRAM memory cell initially in parallel state P.

Referring again to FIG. 3C, at step 302b a read voltage $V_{rd}$ is applied across the MRAM memory cell and a first resistance $R_{d1}$ of the MRAM memory cell is determined. In an embodiment, read voltage $V_{rd}$ is about +0.16V, although other read voltages may be used, such as about −0.16V. In the example illustrated in FIG. 3D1, the MRAM memory cell is initially in anti-parallel state AP, and first resistance $R_{d1}$ is determined at read voltage $V_{rd}$ on the "State AP" line. In the example illustrated in FIG. 3B2, the MRAM memory cell is initially in parallel state P, and first resistance $R_{d1}$ is determined at read voltage $V_{rd}$ on the "State P" line.

Referring again to FIG. 3C, at step 304b a write voltage $V_{AP-P}$ is applied across the MRAM memory cell. In an embodiment, write voltage $V_{AP-P}$ is about +0.5V, although other write voltages $V_{AP-P}$ may be used. If the MRAM memory cell originally was in anti-parallel state AP prior to application of write voltage $V_{AP-P}$, the MRAM memory cell will switch to parallel state P as a result of the write operation. If, however, the MRAM memory cell was in parallel state P prior to application of write voltage $V_{AP-P}$, the MRAM memory cell will remain in parallel state P (i.e., no switching will occur).

In the example illustrated in FIG. 3D1, the MRAM memory cell is initially in anti-parallel state AP, and the MRAM memory cell will switch to parallel state P on the "State P" line. In the example illustrated in FIG. 3D2, the MRAM memory cell is initially in parallel state P, and the MRAM memory cell will remain in parallel state P on the "State P" line.

Referring again to FIG. 3C, at step 306b a read voltage $V_{rd}$ is applied across the MRAM memory cell and a second resistance $R_{d2}$ of the MRAM memory cell is determined. In an embodiment, read voltage $V_{rd}$ is the same voltage used at step 302b (e.g., about +0.16V). In the example illustrated in FIG. 3D1, the MRAM memory cell is in parallel state P, and second resistance $R_{d2}$ is determined at read voltage $V_{rd}$ on the "State P" line. In the example illustrated in FIG. 3D2, the MRAM memory cell is still in parallel state P, and second resistance $R_{d2}$ is determined at read voltage $V_{rd}$ on the "State P" line.

Referring again to FIG. 3C, at 308b a determination is made whether first resistance $R_{d1}$ is greater than second resistance $R_{d2}$. Step 308b is used to determine if the MRAM memory cell changed state as a result of write voltage $V_{AP-P}$ applied at step 304b. In particular, if the MRAM memory cell was originally in anti-parallel state AP prior to application of write voltage $V_{AP-P}$, and switched to parallel state P as a result of the write operation, first resistance $R_{d1}$ will be greater than second resistance $R_{d2}$.

If, however, if the MRAM memory cell was originally in parallel state P prior to application of write voltage $V_{AP-P}$, and remains in parallel state P, first resistance $R_{d1}$ will be substantially equal to second resistance $R_{d2}$. To avoid errors resulting from slight variations in first resistance $R_{d1}$ and second resistance $R_{d2}$ in this scenario (e.g., $R_{d1}$=15.00 KΩ and $R_{d2}$=15.7 KΩ) a scalar multiplier β may be used in step 308b:

$$R_{d1} > (\beta \times R_{d2}) \qquad (3)$$

where β may be between about 1.5-2, although other values may be used. Table 3, below, shows example values for $R_{d1}$, $R_{d2}$, and (β×$R_{d2}$), with β=2:

TABLE 3

| MRAM Cell Initial State | $R_{d1}$ | $R_{d2}$ | β × $R_{d2}$ | $R_{d1}$ > (β × $R_{d2}$) ? |
|---|---|---|---|---|
| P | 15 KΩ | 15 KΩ | 30 KΩ | NO |
| AP | 45 KΩ | 15 KΩ | 30 KΩ | YES |

Referring again to FIG. 3C, if at step 308b a determination is made that first resistance $R_{d1}$ is greater than β times second resistance $R_{d2}$, the MRAM memory cell originally was in anti-parallel state AP prior to application of write voltage $V_{AP-P}$ at step 304b, and thus switched to parallel state P as a result of the write operation. At step 310b a write voltage $V_{P-AP}$ is applied across the MRAM memory cell to return the MRAM memory cell to anti-parallel state AP. In the example illustrated in FIG. 3D1, following application of write voltage $V_{P-AP}$, the MRAM memory switches from parallel state P to anti-parallel state AP. At step 312b, overwrite-read process 300b outputs the read result: the MRAM memory cell is in anti-parallel state AP.

Referring again to FIG. 3C, if however at step 308b a determination is made that first resistance $R_{d1}$ is not greater than β times second resistance $R_{d2}$, the MRAM memory cell originally was in parallel state P prior to application of write voltage $V_{AP-P}$ at step 304b, and remained in parallel state P. Thus, at step 314b, overwrite-read process 300b outputs the read result: the MRAM memory cell is in parallel state P.

Persons of ordinary skill in the art will understand that alternative criteria may be used at step 308b to determine the state of the MRAM memory cell. For example, in an alternative embodiment, at step 308b a determination may be made whether the absolute value of the difference between first resistance $R_{d1}$ and second resistance $R_{d2}$ is greater than Δ times first resistance $R_{d2}$:

$$|R_{d1} - R_{d2}| > (\sigma \times R_{d2}) \qquad (4)$$

where σ is a scalar value that may be between about 0.5-1, although other values may be used. Table 4, below, shows example values for $R_{d1}$, $R_{d2}$, and (σ×$R_{d2}$), with σ=1:

TABLE 4

| MRAM Cell Initial State | $R_{d1}$ | $R_{d2}$ | $|R_{d1} - R_{d2}|$ | σ × $R_{d2}$ | $|R_{d1} - R_{d2}|$ > (σ × $R_{d2}$) ? |
|---|---|---|---|---|---|
| P | 15 KΩ | 15 KΩ | 0 | 15 KΩ | NO |
| AP | 45 KΩ | 15 KΩ | 30 KΩ | 15 KΩ | YES |

Thus, the determination of Equation (4), above, alternatively may be used instead of the determination of Equation (3), above, at step 308b to achieve the same result.

Without wanting to be bound by any particular theory, it is believed that the example overwrite-read process 300b of FIG. 3C may achieve a lower read error rate at lower process tolerances. In particular, without wanting to be bound by any particular theory, it is believed that example overwrite-read process 300b of FIG. 3C may not be sensitive to critical dimension variations from device to device, and may enable larger processes tolerances and hence higher storage densities. In particular, without wanting to be bound by any particular theory, it is believed that example overwrite-read process 300b of FIG. 3B may not be sensitive to variations from cell to cell in wire resistance, offset voltage for access device, and temperature drifts of these parameters.

Figure 3E:
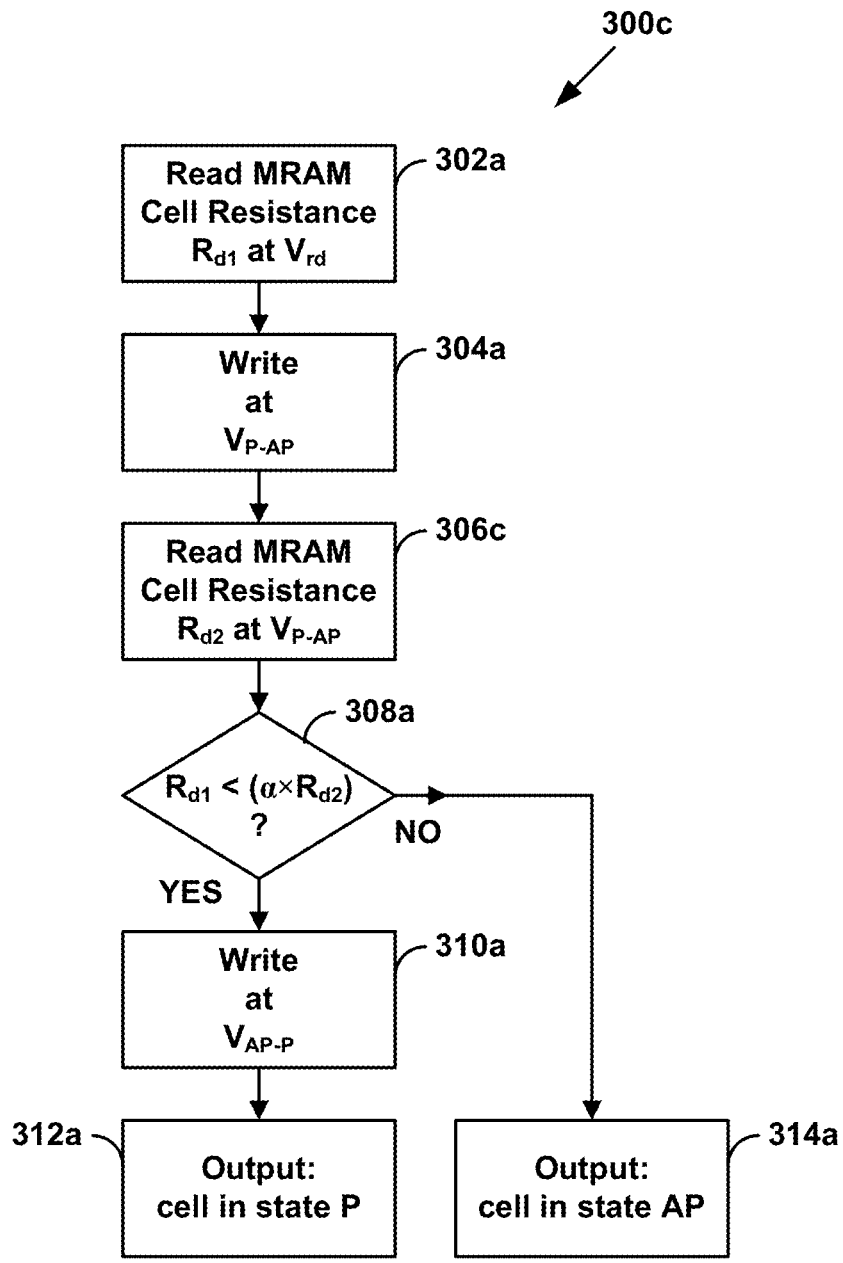
FIG. 3E is a flow chart of another embodiment of a process for reading an MRAM memory cell.

FIG. 3E is a flow chart of an embodiment of another overwrite-read process 300c for reading an MRAM memory cell (e.g., any of MRAM memory cells 10, 50, 70 and 100 of FIGS. 1A-1D, respectively). Overwrite-read process 300c of FIG. 3E is identical to overwrite-read process 300a of FIG. 3A, except that at step 306c, a second resistance $R_{d2}$ of the MRAM memory cell is determined at write voltage $V_{P-AP}$. This technique may be used in memory systems that include circuitry that can detect memory cell resistance during a write operation. An advantage to this technique is that it avoids the need to perform a separate resistance determination at read voltage $V_{rd}$, as in step 306a of overwrite-read process 300a of FIG. 3A.

Figure 3F:
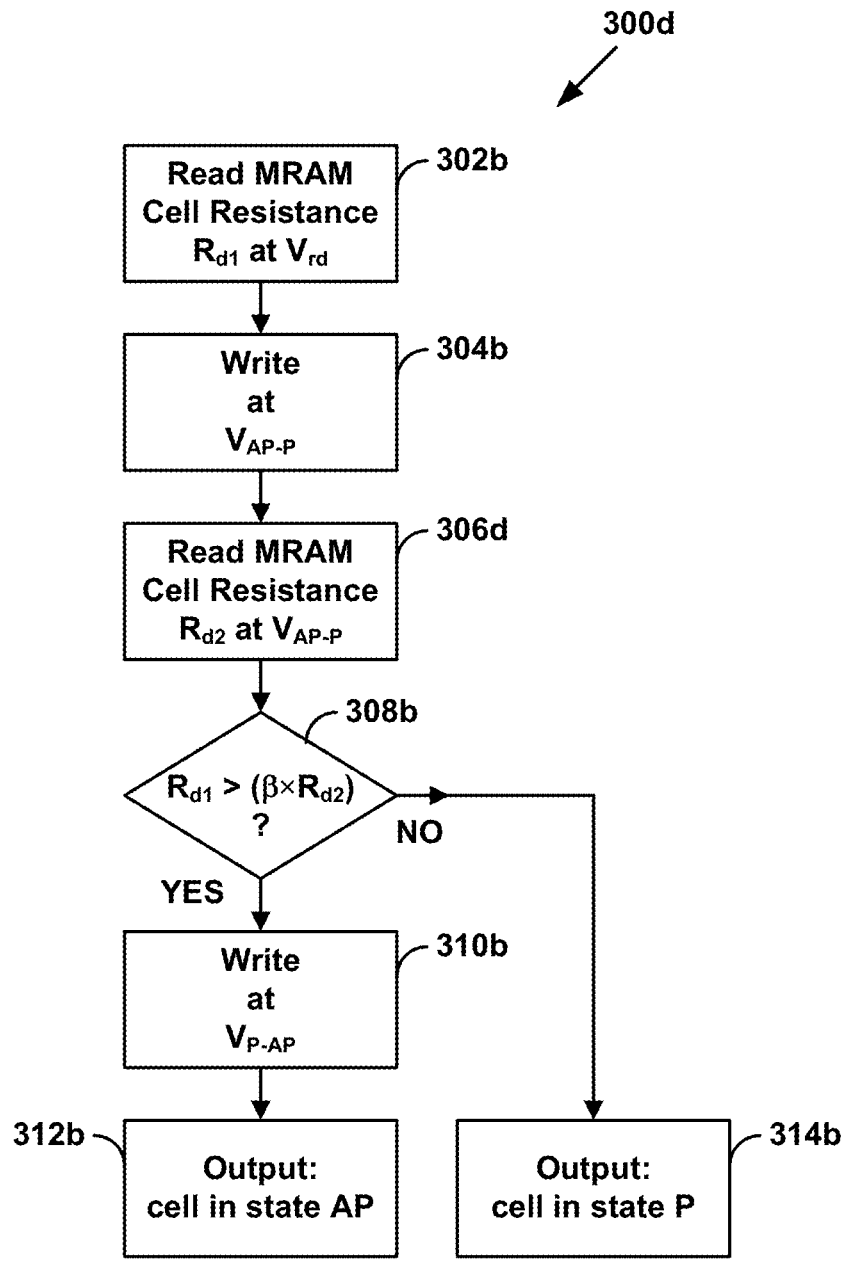
FIG. 3F is a flow chart of another embodiment of a process for reading an MRAM memory cell.

FIG. 3F is a flow chart of an embodiment of another overwrite-read process 300d for reading an MRAM memory cell (e.g., any of MRAM memory cells 10, 50, 70 and 100 of FIGS. 1A-1D, respectively). Overwrite-read process 300d of FIG. 3F is identical to overwrite-read process 300b of FIG. 3C, except that at step 306d, a second resistance $R_{d2}$ of the MRAM memory cell is determined at write voltage $V_{AP-P}$. This technique may be used in memory systems that include circuitry that can detect memory cell resistance during a write operation. An advantage to this technique is that it avoids the need to perform a separate resistance determination at read voltage $V_{rd}$, as in step 306b of overwrite-read process 300b of FIG. 3C.

Figure 3G:
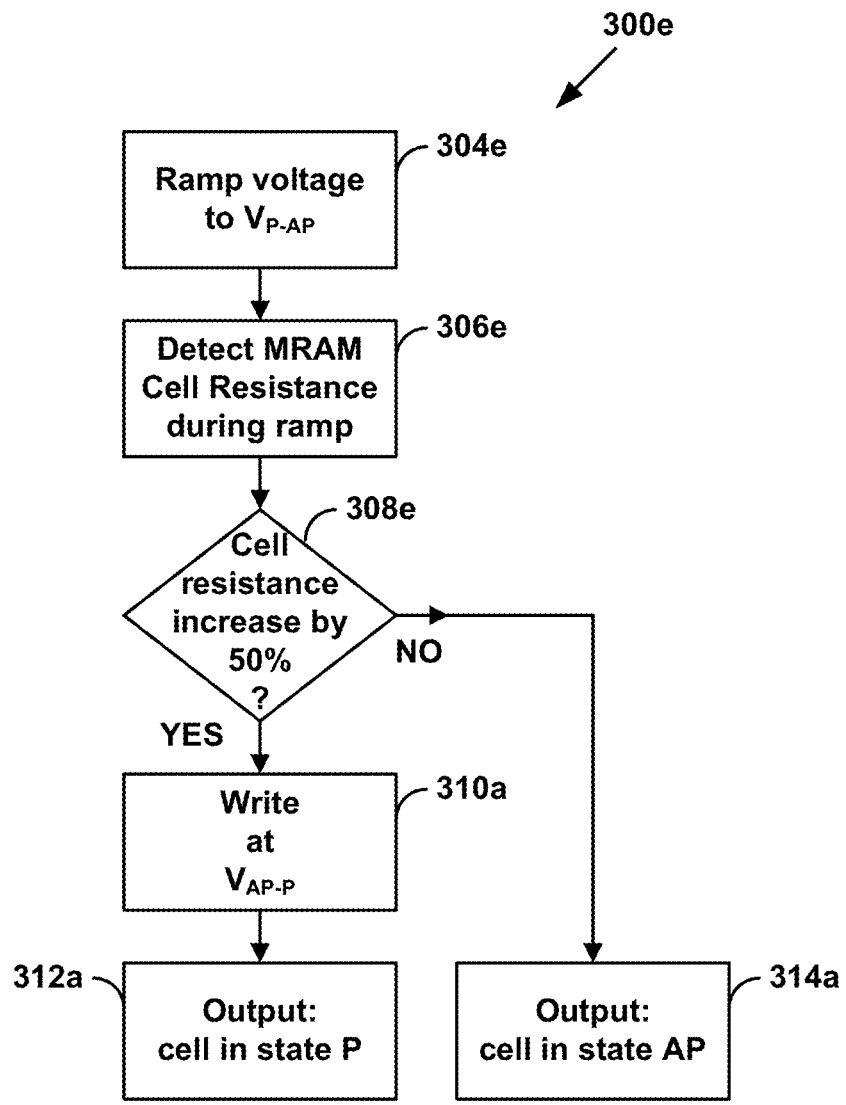
FIG. 3G is a flow chart of another embodiment of a process for reading an MRAM memory cell.

FIG. 3G is a flow chart of an embodiment of another overwrite-read process 300e for reading an MRAM memory cell (e.g., any of MRAM memory cells 10, 50, 70 and 100 of FIGS. 1A-1D, respectively). Overwrite-read process 300e of FIG. 3G is similar to overwrite-read process 300a of FIG. 3A, except that rather than applying static read and write voltages to an MRAM memory cell, and then reading the resistance of an MRAM memory cell at distinct read voltages, MRAM cell resistance is determined during a voltage ramp.

In particular, at step 304e, a write voltage ramp to $V_{P-AP}$ is applied across the MRAM memory cell. In an embodiment, write voltage $V_{P-AP}$ is about −0.5V, although other write voltages $V_{P-AP}$ may be used. If the MRAM memory cell originally was in parallel state P prior to application of the write voltage ramp, the MRAM memory cell will switch to anti-parallel state AP as a result of the write operation. If, however, the MRAM memory cell was in anti-parallel state AP prior to application of the write voltage ramp, the MRAM memory cell will remain in anti-parallel state AP (i.e., no switching will occur).

At step 306e, a resistance of the MRAM memory cell is determined during the write voltage ramp of step 304e. This technique may be used in memory systems that include circuitry that can detect memory cell resistance during a write operation. An advantage to this technique is that it avoids the need to perform a separate resistance determination at read voltage $V_{rd}$, as in step 306a of overwrite-read process 300a of FIG. 3A.

At step 308e, a determination is made whether the resistance of the MRAM memory cell increased by a particular amount (e.g., 50% or some other percentage) over the course of the write voltage ramp.

If at step 308e a determination is made that the resistance of the MRAM memory cell increased by a particular amount (e.g., 50%), the MRAM memory cell originally was in parallel state P prior to application of the write voltage ramp at step 304e, and thus switched to anti-parallel state AP as a result of the write operation. At step 310a a write voltage $V_{AP-P}$ is applied across the MRAM memory cell to return the MRAM memory cell to parallel state P. At step 312a, overwrite-read process 300a outputs the read result: the MRAM memory cell is in parallel state P.

If however at step 308e a determination is made that the resistance of the MRAM memory cell did not increase by a particular amount (e.g., 50%), the MRAM memory cell originally was in anti-parallel state AP prior to application of the write voltage ramp at step 304e, and remained in anti-parallel state AP. Thus, at step 314a, overwrite-read process 300a outputs the read result: the MRAM memory cell is in anti-parallel state AP.

Overwrite-read processes 300a, 300b, 300c, 300d and 300e of FIGS. 3A, 3C, 3E, 3F and 3G, respectively, may be used with MRAM memory cells 10, 50, 70 and 100 of FIGS. 1A-1D, respectively.

Figure 3H:
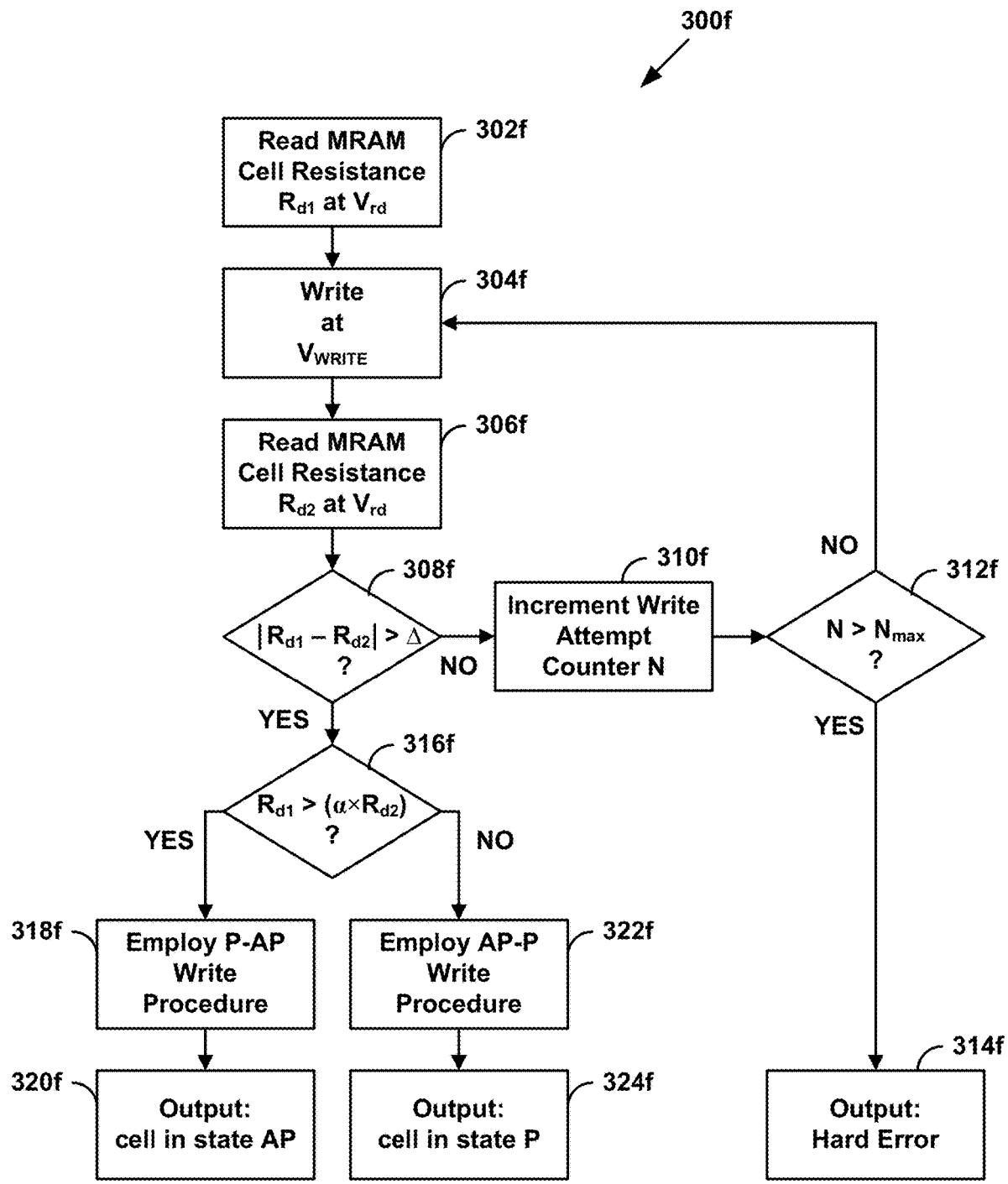
FIG. 3H is a flow chart of another embodiment of a process for reading an MRAM memory cell.

FIG. 3H is a flow chart of an embodiment of an overwrite-read process 300f for reading a VCMA MRAM memory cell. At step 302F, a read voltage $V_{rd}$ is applied across the VCMA MRAM memory cell and a first resistance $R_{d1}$ of the VCMA MRAM memory cell is determined. In an embodiment, read voltage $V_{rd}$ is about 1.0 V between conductor 82 and conductor 80, although other read voltages may be used, such as about 0.5 V or about 2.0 V. The read voltage polarity can be chosen so that the magnetic anisotropy is increased during read.

At step 304F a write voltage $V_{WRITE}$ is applied across the VCMA MRAM memory cell. In an embodiment, write voltage $V_{WRITE}$ is about −1.0 V, although other write voltages $V_{WRITE}$ may be used, such as about −2.0 V. As a result of the write operation, the VCMA MRAM memory cell will oscillate between the AP and P state over a time scale determined by the magnetic field present in the free layer. The write error rate is minimized if the write pulse duration is chosen to match the half period of the oscillation frequency.

At step 306F a read voltage $V_{rd}$ is applied across the VCMA MRAM memory cell and a second resistance $R_{d2}$ of the MRAM memory cell is determined. In an embodiment, read voltage $V_{rd}$ is the same voltage used at step 302F (e.g., about 1.0 V).

At step 308f a determination is made whether the VCMA MRAM memory cell changed state as a result of the write operation at step 304f. In an embodiment, a determination is made whether an absolute value of a difference between first resistance $R_{d1}$ and second resistance $R_{d2}$ is greater than Δ, where Δ may be between about 50 kΩ and about 100 kΩ, although other values may be used.

If the absolute value of a difference between first resistance $R_{d1}$ and second resistance $R_{d2}$ is not greater than Δ, at step 310f a write counter N is incremented. At step 312f, a determination is made whether write counter N exceeds a maximum value $N_{MAX}$. If write counter N does not exceed a maximum value $N_{MAX}$, the process returns to step 304f to apply another write voltage $V_{WRITE}$ across the VCMA MRAM memory cell. If, however, write counter N exceeds maximum value $N_{MAX}$, at step 314f an output is generated indicating a hard error occurred while attempting to read the VCMA MRAM memory cell.

If at step 308f a determination is made that the absolute value of a difference between first resistance $R_{d1}$ and second resistance $R_{d2}$ is greater than Δ, at step 316f a determination is made whether first resistance $R_{d1}$ is less than second resistance $R_{d2}$. Step 316f is used to determine if the VCMA MRAM memory cell changed state as a result of write voltage $V_{WRITE}$ applied at step 304f.

If at step 316f a determination is made that first resistance $R_{d1}$ is less than α times second resistance $R_{d2}$, the VCMA MRAM memory cell originally was in anti-parallel state AP prior to application of write voltage $V_{WRITE}$ at step 304f. At step 318f a P-AP write procedure is applied to the VCMA MRAM memory cell to return the VCMA MRAM memory cell to anti-parallel state AP. At step 320f, overwrite-read process 300f outputs the read result: the VCMA MRAM memory cell is in anti-parallel state AP.

If however at step 316f a determination is made that first resistance $R_{d1}$ is not less than α times second resistance $R_{d2}$, the VCMA MRAM memory cell originally was in parallel state P prior to application of write voltage $V_{WRITE}$ at step 304f. At step 322f a AP-P write procedure is applied to the VCMA MRAM memory cell to return the VCMA MRAM memory cell to parallel state P. At step 324f, overwrite-read process 300f outputs the read result: the VCMA MRAM memory cell is in parallel state P.

Overwrite-read processes 300a, 300b, 300c, 300d, 300e and 300f of FIGS. 3A, 3C, 3E, 3F, 3G and 3H, respectively, may be used for every read operation of an MRAM memory cell. Alternatively, overwrite-read process 300a, 300b, 300c, 300d, 300e and 300f of FIGS. 3A, 3C, 3E, 3F, 3G and 3H, respectively, may be used selectively to read MRAM memory cells. For example, the example overwrite-read processes 300a, 300b, 300c, 300d, 300e and 300f of FIGS. 3A, 3C, 3E, 3F, 3G and 3H, respectively, may be used as part of an error recovery procedure, and may not be used on every read operation.

In particular, some memory systems include an ECC engine used to detect and correct data corruption. In embodiments, an ECC engine includes an ECC encoder that is configured to receive data to be stored at the memory and to generate a codeword that also is stored at the memory. In embodiments, an ECC engine also includes an ECC decoder that is configured to decode data read from the memory (referred to herein as an "ECC block") to detect and correct, up to an error correction capability of the ECC scheme, any bit errors that may be present in the ECC block.

Figure 4:
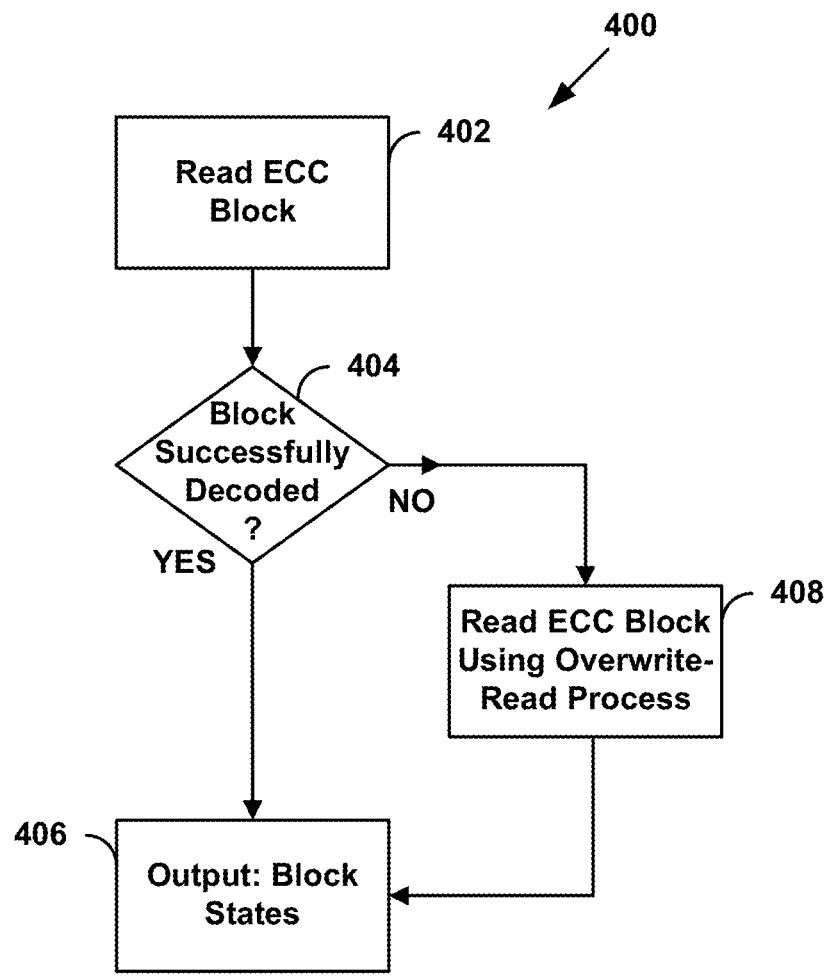
FIG. 4 is flow chart of an embodiment of a process for using an overwrite-read process as part of an error recovery procedure.

FIG. 4 is a flow chart of an embodiment of a process 400 for using an overwrite-read process (such as overwrite-read process 300a, 300b, 300c, 300d, 300e and 300f of FIGS. 3A, 3C, 3E, 3F, 3G and 3H, respectively) as part of an error recovery procedure. At step 402, an ECC block is read. For example, an ECC block may include 256 data bit and 63 parity bit, although other values may be used.

At step 404, a determination is made whether the ECC block read at step 402 was successfully decoded. For example, a determination is made whether the ECC decoder successfully detected and corrected any bit errors present in the ECC block read at step 402. If a determination is made that the ECC decoder was able to successfully decode the ECC bloc, at step 406 the data states of the ECC block are output.

If, however, a determination is made that the ECC decoder was not able to successfully decode the ECC bloc, at step 408 the ECC block is read using an overwrite-read process (such as overwrite-read process 300a, 300b, 300c, 300d, 300e and 300f of FIGS. 3A, 3C, 3E, 3F, 3G and 3H, respectively). At step 406 the data states of the ECC block read using the overwrite-read process are output.

Without wanting to be bound by any particular theory, it is believed that selectively performing an overwrite-read process, such as in the process 400 of FIG. 4 may result in decreased read latency, decreased power consumption, and increased endurance of a memory device.

The embodiments described above implied analog reads of the MRAM memory cell resistance. Although analog reads may be used to determine the resistance of an MRAM memory cell, the resistance also can be inferred from digital reads performed at different reference currents. An example digital read of an MRAM memory cell may be performed as follows: (1) apply a read voltage $V_{rd}$ across the MRAM memory cell; (2) measure a read current $I_{rd}$ conducted by the MRAM memory cell; (2) compare the measured read current $I_{rd}$ to a reference current $I_{ref}$ (e.g., using comparator circuitry); and (3) output 0 if $I_{rd} < I_{ref}$, and output 1 if $I_{rd} \geq I_{ref}$.

Figure 5:
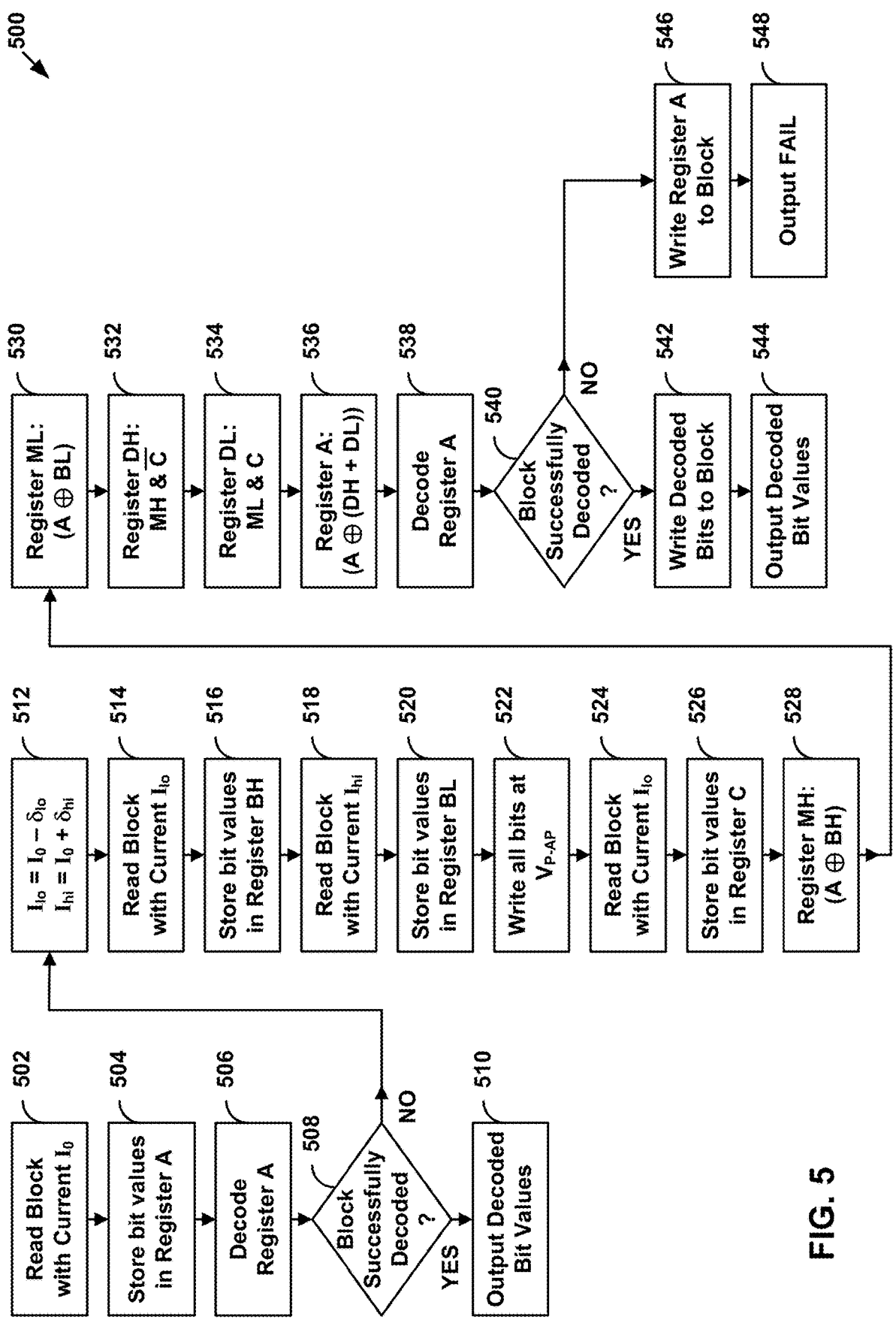
FIG. 5 is a flow chart of an embodiment of a process for using an overwrite-read process as part of an error recovery procedure that uses multiple digital reads and logic operations.

FIG. 5 is a block diagram of an embodiment of a process 500 that uses multiple digital reads and logic operations to identify and correct erroneous high resistance cells in the parallel state P and low resistance cells in the anti-parallel state AP in a block of MRAM memory cells. The block is assumed to be an ECC block (e.g. 256 data bits+63 parity bits). FIGS. 6A-6F depict example current-versus voltage characteristics of MRAM memory cells to facilitate an understanding of process 500.

Figure 6A:
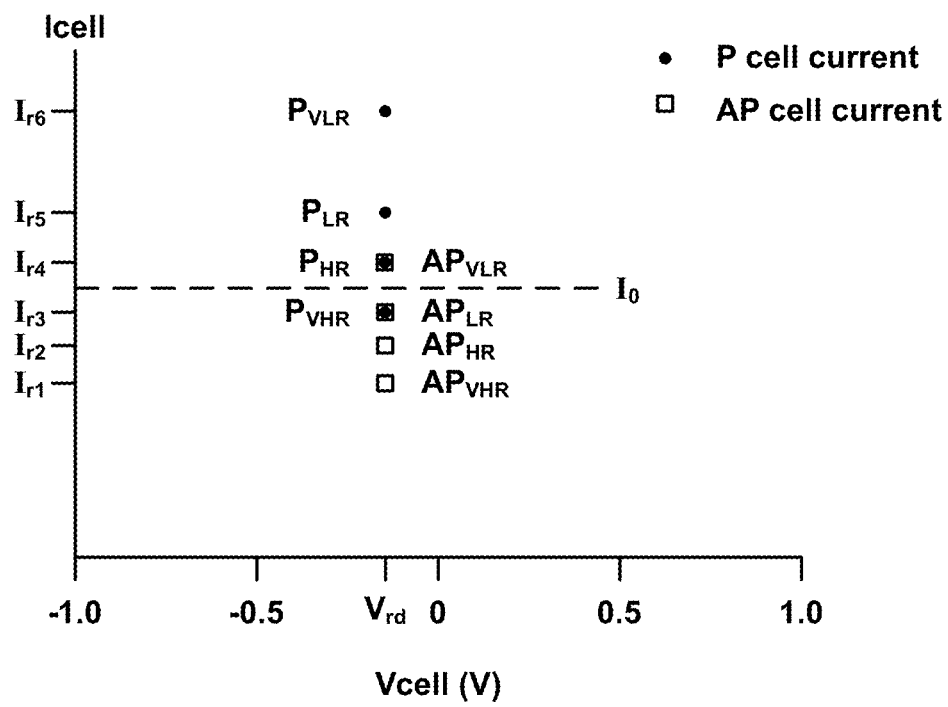

At step 502, the block of MRAM memory cells are read using an initial reference current $I_{ref} = I_0$, and at step 504, the resulting bit values are stored in a first register (Register A). FIG. 6A depicts an example current-versus voltage characteristics of MRAM memory cells in the block, assuming that the block includes MRAM memory cells that may be classified into eight populations:

| | | | |
|---|---|---|---|
| $AP_{VHR}$ | very high resistance anti-parallel state AP MRAM memory cell | $P_{VHR}$ | very high resistance parallel state P MRAM memory cell |
| $AP_{HR}$ | high resistance anti-parallel state AP MRAM memory cell | $P_{HR}$ | high resistance parallel state P MRAM memory cell |
| $AP_{LR}$ | low resistance anti-parallel state AP MRAM memory cell | $P_{LR}$ | low resistance parallel state P MRAM memory cell |
| $AP_{VLR}$ | very low resistance anti-parallel state AP MRAM memory cell | $P_{VLR}$ | very low resistance parallel state P MRAM memory cell |

Persons of ordinary skill in the art will understand that a block of MRAM memory cells may be classified into more or fewer than eight populations.

In the example of FIG. 6A, all anti-parallel state AP MRAM memory cells have an initial cell state=0, and all parallel state P MRAM memory cells have an initial cell state=1. In this example, the resistance (in arbitrary units U) for $AP_{VHR}$, $AP_{HR}$, $AP_{LR}$, $AP_{VLR}$, $P_{VHR}$, $P_{HR}$, $P_{LR}$, $P_{VLR}$ MRAM memory cells in the block is 6U, 4U, 3U, 2U, 3U, 2U, 1.5U, 1U, respectively. That is, in this example $P_{LR}$ MRAM memory cells have a resistance 1.5 times that of $P_{VLR}$ MRAM memory cells, $AP_{VLR}$ MRAM memory cells have a resistance 6 times that of $P_{VLR}$ MRAM memory cells, and so forth.

In addition, in this example the resistance of $AP_{VLR}$ MRAM memory cells is the same as the resistance of $P_{HR}$ MRAM memory cells (2U), and the resistance of $P_{VHR}$ MRAM memory cells is the same as the resistance of $AP_{LR}$ MRAM memory cells (3U). As a result, the $AP_{VLR}$ MRAM memory cells and the $P_{VHR}$ MRAM memory cells are the memory cell populations that cause read errors.

In particular, at read voltage $V_{rd}$, the read current of $AP_{VHR}$, $AP_{HR}$, $AP_{LR}$, $AP_{VLR}$, $P_{VHR}$, $P_{HR}$, $P_{LR}$, $P_{VLR}$ MRAM memory cells are $I_{r1}$, $I_{r2}$, $I_{r3}$, $I_{r4}$, $I_{r3}$, $I_{r4}$, $I_{r5}$, $I_{r6}$, respectively. With a reference current $I_{ref} = I_0$ as shown in FIG. 6A, the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells read into Register A are 0, 0, 0, 1, 0, 1, 1, 1, respectively. As a result, the read values of the $AP_{VLR}$ and $P_{VHR}$ MRAM memory cells are erroneous (compare the cell state values in Register A with the Initial Cell State values in FIG. 6A).

Referring again to FIG. 5, at step 506 cell state values of Register A are decoded (e.g., using an ECC decoding scheme). At step 508, a determination is made whether the block was successfully decoded at step 506. If the block was successfully decoded, at step 510 the decoded bit values of the block are output. In the example depicted in FIG. 6A, Register A includes errors for $AP_{VLR}$ and $P_{VHR}$ MRAM memory cells, and was not successfully decoded.

Accordingly, referring again to FIG. 5, if at step 508 a determination is made that the block was not successfully decoded at step 506, at step 512 two new reference current values are calculated: $I_{lo} = (I_0 - \delta_{lo})$, and $I_{hi} = (I_0 + \delta_{hi})$, where $\delta_{lo}$=an incremental low current offset value, and $\delta_{hi}$=an incremental high current offset value. In embodiments, $\delta_{lo}$ may be between about 0.5 µA and about 5 µA, and $\delta_{hi}$ may be between about 0.5 µA and about 5 µA, although other values may be used.

Figure 6B:
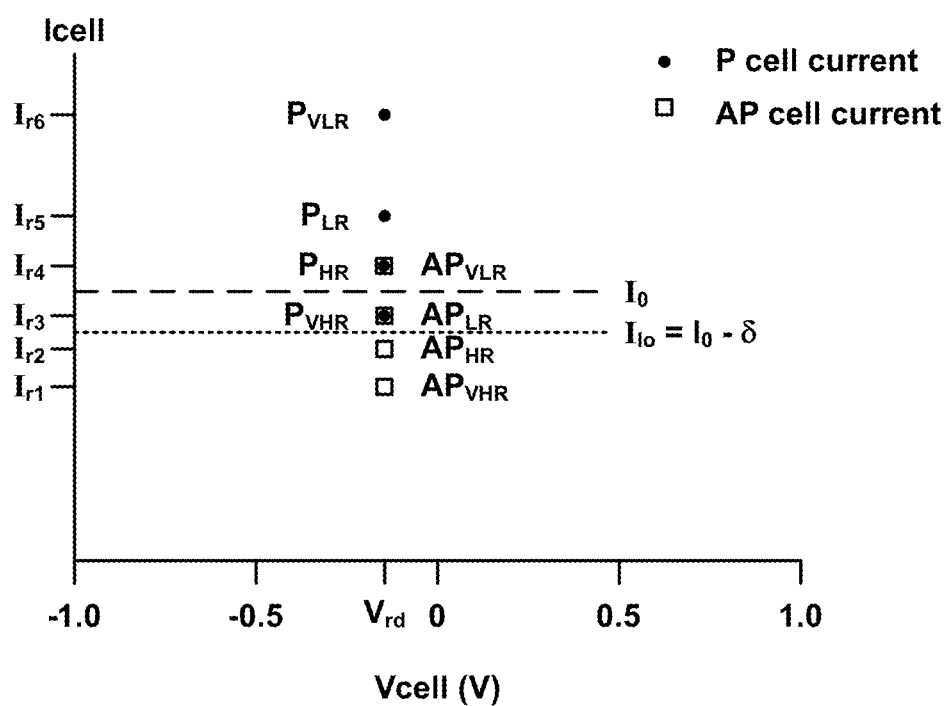

At step 514 the block of MRAM memory cells are read using a reference current $I_{ref} = I_{lo}$, and at step 516, the resulting bit values are stored in a second register (Register BH). FIG. 6B depicts example current-versus voltage characteristics of MRAM memory cells in the block. With a reference current $I_{ref} = I_{lo}$ as shown in FIG. 6B, the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells read into Register BH are 0, 0, 1, 1, 1, 1, 1, 1, respectively.

Figure 6C:
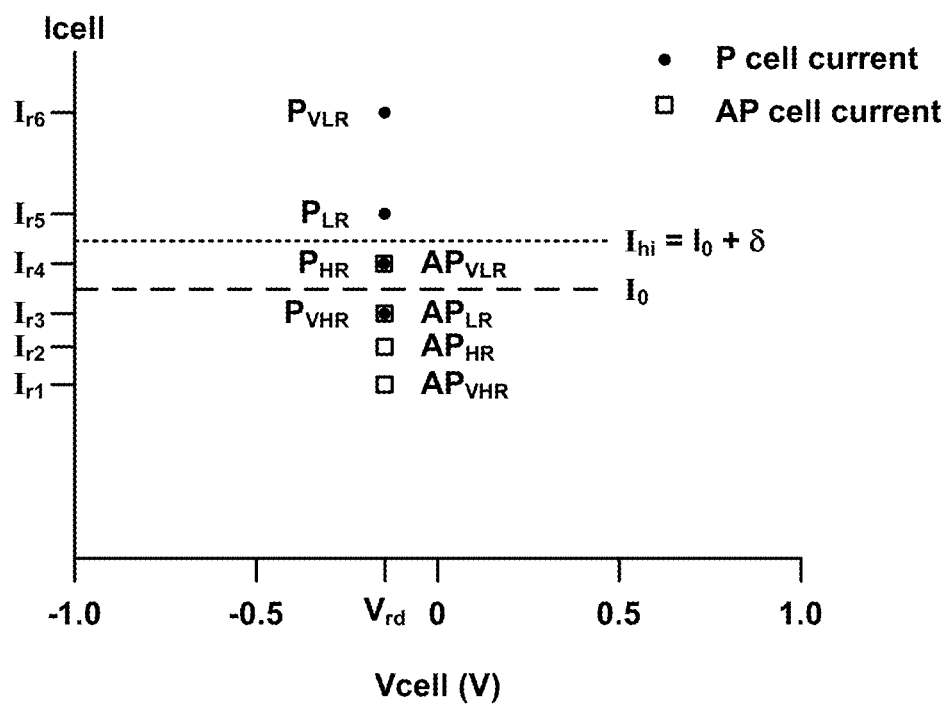

Referring again to FIG. 5, at step 518 the block of MRAM memory cells are read using a reference current $I_{ref} = I_{hi}$, and at step 520, the resulting bit values are stored in a third register (Register BL). FIG. 6C depicts example current-versus voltage characteristics of MRAM memory cells in the block. With a reference current $I_{ref} = I_{hi}$ as shown in FIG. 6C, the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells read into Register BL are 0, 0, 0, 0, 0, 0, 1, 1, respectively.

Figure 6D:
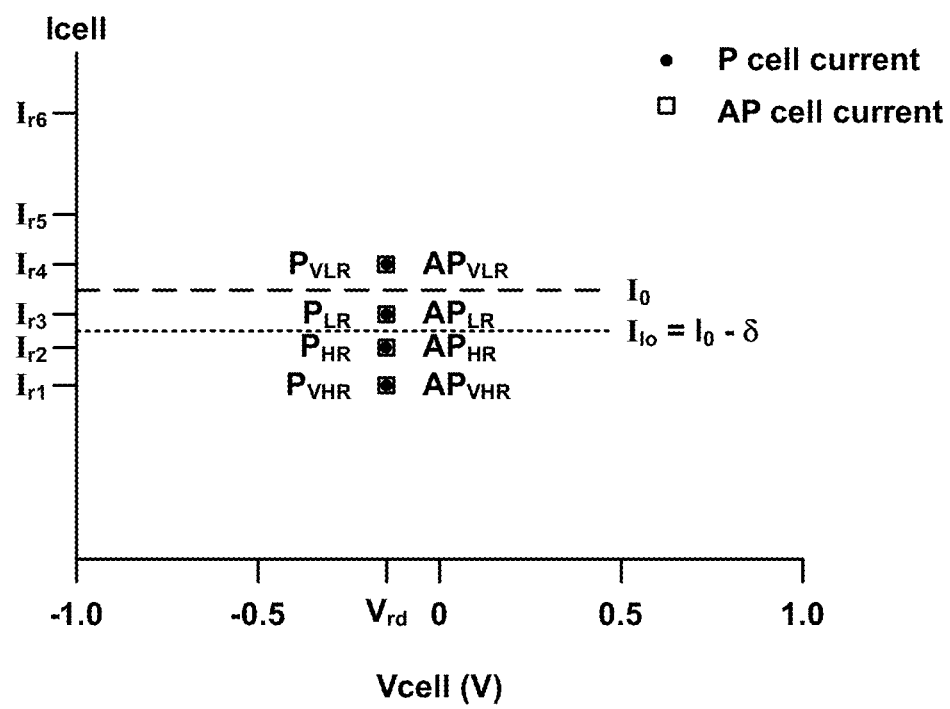

Referring again to FIG. 5, at step 522 a write voltage $V_{P-AP}$ is applied across all MRAM memory cells in the block so that all of the memory cells in the block are in anti-parallel state AP. At step 524 the block of MRAM memory cells are read using a reference current $I_{ref} = I_{lo}$, and at step 526, the resulting bit values are stored in a fourth register (Register C). FIG. 6D depicts example current-versus voltage characteristics of MRAM memory cells in the block. With a reference current $I_{ref} = I_{lo}$ as shown in FIG. 6D, the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells read into Register C are 0, 0, 1, 1, 0, 0, 1, 1, respectively.

Referring again to FIG. 5, at step 528 a fifth register (Register MH) is determined using the following logical operations:

$$MH = (A \oplus BH)$$

At step 530, a sixth register (Register ML) is determined using the following logical operations:

$$ML = (A \oplus BL)$$

Figure 6E:
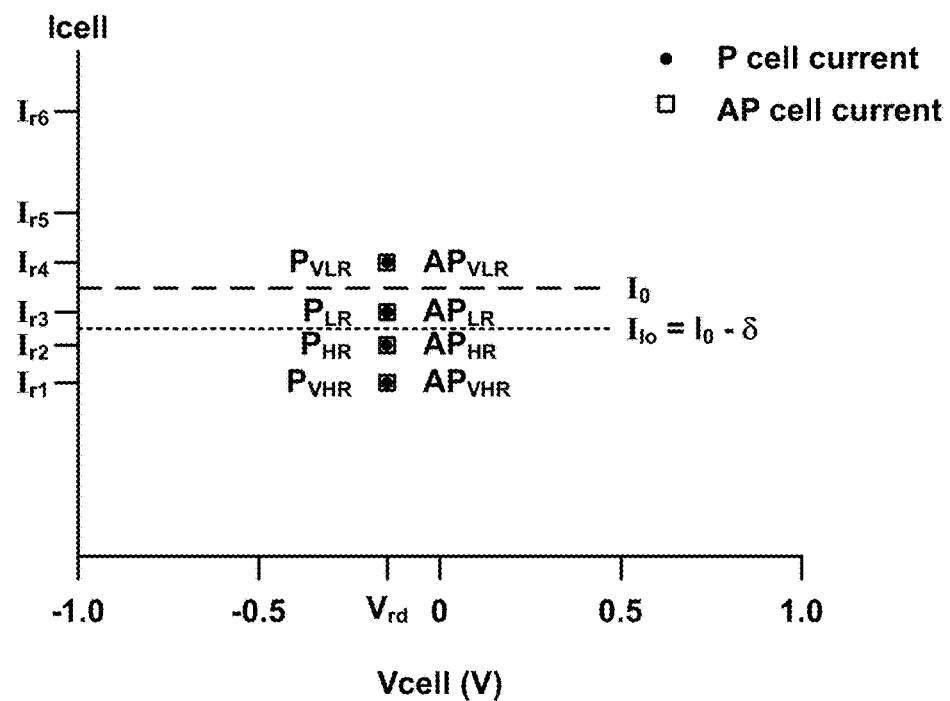

FIG. 6E depicts example current-versus voltage characteristics of MRAM memory cells in the block, and shows that the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells stored in Register MH are 0, 0, 1, 0, 1, 0, 0, 0, respectively, and shows that the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells stored in Register ML are 0, 0, 0, 1, 0, 1, 0, 0, respectively.

Referring again to FIG. 5, at step 532 a seventh register (Register DH) is determined using the following logical operations:

$$DH = MH \text{ AND } \overline{C}$$

At step 534, an eighth register (Register DL) is determined using the following logical operations:

$$DL = ML \text{ AND } C$$

At step 536, first register (Register A) is updated using the following logical operations:

$$A = A \oplus (DH \text{ OR } DL)$$

FIG. 6F depicts example current-versus voltage characteristics of MRAM memory cells in the block, and shows that the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells stored in Register DH are 0, 0, 0, 0, 1, 0, 0, 0, respectively, the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells stored in Register DL are 0, 0, 0, 1, 0, 0, 0, 0, respectively, and the cell state of the $AP_{VHR}$, $AP_{HR}$, $AP_{LR}$, $AP_{VLR}$, $P_{VHR}$, $P_{HR}$, $P_{LR}$, $P_{VLR}$ MRAM memory cells stored in Register A are 0, 0, 0, 0, 1, 1, 1, 1, respectively.

Referring again to FIG. 5, at step 538 cell state values of Register A are decoded (e.g., using an ECC decoding scheme). At step 540, a determination is made whether the block was successfully decoded at step 538. If the block was successfully decoded, at step 542 the decoded bit values are written to the block, and at step 544 the decoded bit values of the block are output. In the example depicted in FIG. 6F, Register A does not include any bit errors, and thus at step 540 the determination is made that the block was successfully decoded at step 538. Accordingly, at step 542 the decoded bit values are written to the block, and at step 544 the decoded bit values of the block are output.

Referring again to FIG. 5, if at step 540 a determination is made that the block was not successfully decoded at step 538, at step 546 the bit values of Register A are written to the block, and at step 548 the decoding operation is indicated as having failed.

Without wanting to be bound by any particular theory, it is believed that the example process 500 of FIG. 5 can identify and correct erroneous high resistance cells in the parallel state P and low resistance cells in the anti-parallel state AP in a block of MRAM memory cells.

The procedure depicted in FIG. 5 can be modified to improve the resolution with which bit resistance values are inferred, and may thereby further reduce read error rate. In an embodiment, steps 512 through 520 may be modified to include additional reads performed at $I_{lo}(n)=(I_0-n*\delta_{lo})$, and $I_{hi}(n)=(I_0+n*\delta_{hi})$, which are stored in N registers BH(n) and N registers BL(n) respectively, where $n=1, \ldots, N$, and N is an integer between 2 and 10 (or more). Following the writing of all bits at voltage $V_{P-AP}$, steps 524 through 540 can be iterated using different register values BH(n) and BL(n). In another embodiment, the read operation at step 524 is performed twice using different reference currents $I_{lo}(n)$ and $I_{hi}(n)$ $-\delta_{lo}-\delta_{hi}$, with each value stored in a different register CH and CL. In another embodiment, an additional register V can be used to track which bits have already been verified at each iteration and no longer considered as candidates for incorrectly read bits. The iterative procedure stops either after N iterations or after the register A has correctly been decoded.

Figure 7:
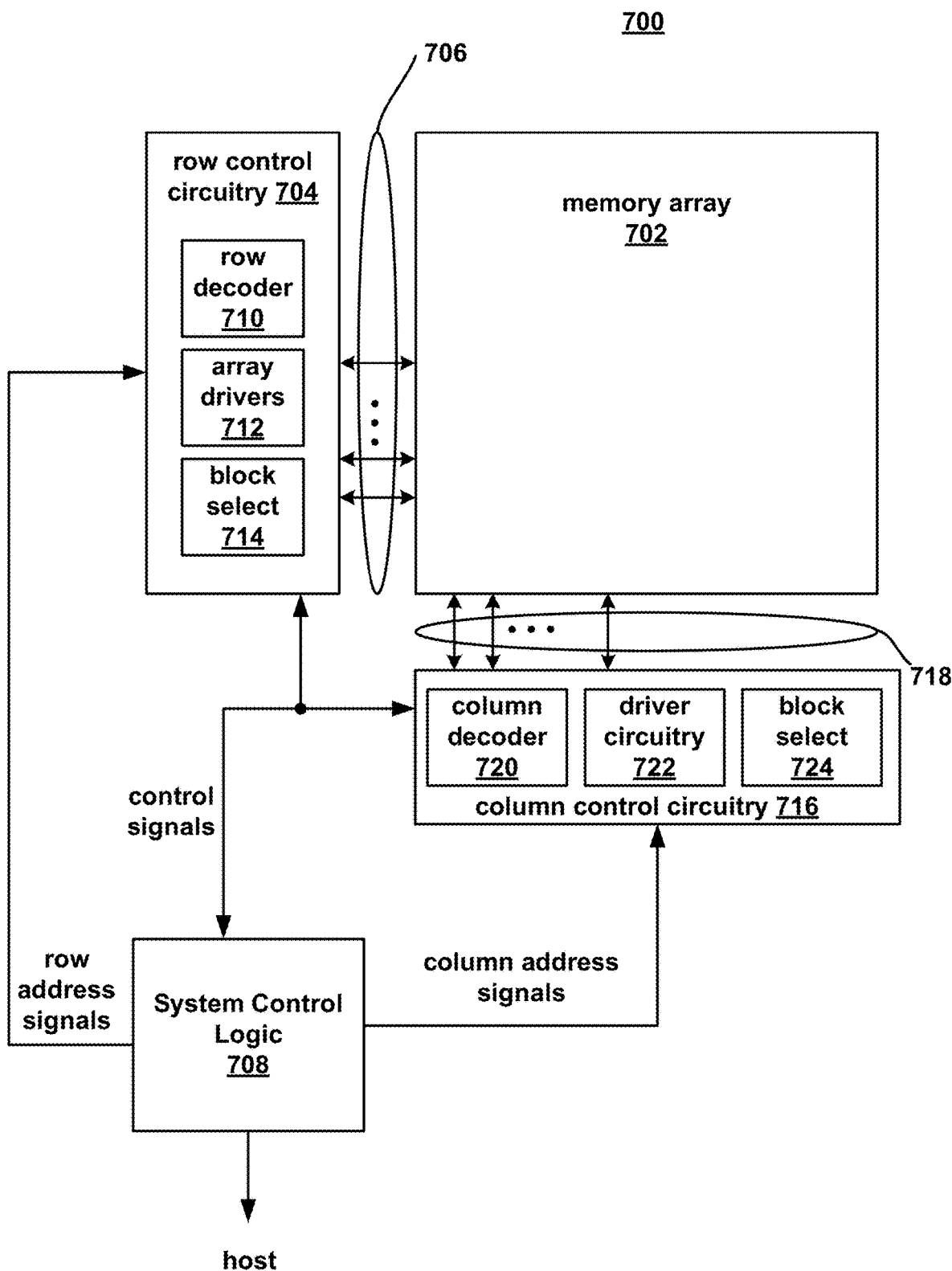
FIG. 7 is a block diagram of a memory system that uses the overwrite-read techniques described herein.

FIG. 7 is a block diagram that depicts one example of a memory system 700 that can implement the technology described herein. Memory system 700 includes a memory array 702 that can include any of the memory cells described above. The array terminal lines of memory array 702 include the various layer(s) of word lines organized as rows, and the various layer(s) of bit lines organized as columns. However, other orientations also can be implemented.

Memory system 700 includes row control circuitry 704, whose outputs 706 are connected to respective word lines of the memory array 702. Row control circuitry 704 receives a group of M row address signals and one or more various control signals from System Control Logic circuit 708, and typically may include such circuits as row decoders 710, array terminal drivers 712, and block select circuitry 714 for both reading and writing operations.

Memory system 700 also includes column control circuitry 716 whose input/outputs 718 are connected to respective bit lines of the memory array 702. Column control circuitry 718 receives a group of N column address signals and one or more various control signals from System Control Logic 708, and typically may include such circuits as column decoders 720, array terminal receivers or drivers 722, block select circuitry 724, as well as read/write circuitry, and I/O multiplexers.

System control logic 708 receives data and commands from a host and provides output data to the host and status. In other embodiments, system control logic 708 receives data and commands from a separate controller circuit and provides output data to that controller circuit, with the controller circuit communicating with the host. System control logic 708 may include one or more state machines, registers and other control logic for controlling the operation of memory system 700.

In one embodiment, all of the components depicted in FIG. 7 are arranged on a single integrated circuit. For example, system control logic 708, column control circuitry 716 and row control circuitry 704 are formed on the surface of a substrate and memory array 702 is formed one or above the substrate.

In an embodiment, one or more of memory array 702, row control circuitry 704, column control circuitry 716 and system control logic 708 constitute a system control circuit that includes hardware and/or software configured to implement the methods 300a, 300b, 300c, 300d, 300e, 300f, 400 and 500 of FIGS. 3A, 3C, 3E, 3F, 3G, 3H, 4 and 5, respectively.

Although the technology described above and the example methods 300a, 300b, 300c, 300d, 300e, 300f, 400 and 500 of FIGS. 3A, 3C, 3E, 3F, 3G, 3H, 4 and 5, respectively, have been described with reference to MRAM memory cells, persons of ordinary skill in the art will understand that the technology may be used with any resistance-switching memory cells, including MRAM memory cells, phase change memory cells, reversible resistance-switching random access memory cell (ReRAM) memory cells, and other resistance-switching memory cells. In addition, the technology described above and the example methods 300a, 300b, 300c, 300d, 300e, 300f, 400 and 500 of FIGS. 3A, 3C, 3E, 3F, 3G, 3H, 4, respectively, may be used with individual resistance-switching memory cells or blocks of multiple resistance-switching memory cells.

One embodiment includes a method that includes applying a read voltage to a resistance-switching memory cell to determine a first memory cell resistance, applying a first write voltage to the resistance-switching memory cell, applying the read voltage to the resistance-switching memory cell to determine a second memory cell resistance, and comparing the first memory cell resistance to the second memory cell resistance to determine that the resistance-switching memory cell is in a first memory state or a second memory state.

One embodiment includes a system that includes a control circuit configured to apply a read voltage to a resistance-switching memory cell to determine a first memory cell resistance, apply a first write voltage to the resistance-switching memory cell, determine a second memory cell resistance of the resistance-switching memory cell at the first write voltage, and compare the first memory cell resistance to the second memory cell resistance to determine that the resistance-switching memory cell is in a first memory state or a second memory state.

One embodiment includes a method that includes measuring read currents of each of a plurality of resistance-switching memory cells, comparing each of the measured read currents to a first reference current to determine a first set of bit values for each of the resistance-switching memory cells, comparing each of the measured read currents to a second reference current to determine a second set of bit values for each of the resistance-switching memory cells, comparing each of the measured read currents to a third reference current to determine a third set of bit values for each of the resistance-switching memory cells, applying a write voltage to each of the resistance-switching memory cells, comparing each of the measured read currents to the second reference current to determine a fourth set of bit values for each of the resistance-switching memory cells, and performing logic operations on the first set of bit values, the second set of bit values, the third set of bit values and the fourth set of bit values to correct bit errors in the first set of bit values.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:
1. A method comprising:
first reading a plurality of resistance-switching memory cells comprising a block of data;
decoding the first read block of data using an error correction code decoder; and
based on results of the decoding, selectively second reading the plurality of resistance-switching memory cells by performing an overwrite-read process to read the block of data,
wherein the overwrite read process determines a change in resistance of the resistance-switching memory cells in response to a write pulse.

2. The method of claim 1, wherein for each resistance-switching memory cell of the plurality of resistance-switching memory cells the overwrite-read process comprises:
applying a read voltage to the resistance-switching memory cell to determine a first memory cell resistance;
applying a first write voltage to the resistance-switching memory cell;
applying the read voltage to the resistance-switching memory cell to determine a second memory cell resistance; and
comparing the first memory cell resistance to the second memory cell resistance to determine that the resistance-switching memory cell is in a first memory state or a second memory state.

3. The method of claim 1, wherein the first write voltage does not switch a memory state of the resistance-switching memory cell.

4. The method of claim 1, further comprising:
determining that the first memory cell resistance is less than the second memory cell resistance;
applying a second write voltage to the resistance-switching memory cell; and
determining that the resistance-switching memory cell is in the first memory state.

5. The method of claim 4, wherein:
the first write voltage switches the resistance-switching memory cell from the first memory state to the second memory state; and
the second write voltage switches the resistance-switching memory cell from the second memory state to the first memory state.

6. The method of claim 4, wherein the first write voltage has a polarity opposite the second write voltage.

7. The method of claim 1, further comprising:
determining that the first memory cell resistance is not less than the second memory cell resistance; and determining that the resistance-switching memory cell is in the second memory state.

8. The method of claim 1, further comprising:
determining that the first memory cell resistance is greater than the second memory cell resistance;
applying a second write voltage to the first resistance-switching memory cell; and
determining that the resistance-switching memory cell is in the second memory state.

9. The method of claim 8, wherein:
the first write voltage switches the resistance-switching memory cell from the second memory state to the first memory state; and
the second write voltage switches the resistance-switching memory cell from the first memory state to the second memory state.

10. The method of claim 8, wherein the first write voltage has a polarity opposite the second write voltage.

11. The method of claim 1, further comprising:
determining that the first memory cell resistance is not greater than the second memory cell resistance; and
determining that the resistance-switching memory cell is in the first memory state.

12. The method of claim 1, wherein each of the plurality of resistance-switching memory cells comprises any of a spin-transfer-torque driven magnetoresistive random access memory cell, a voltage control of magnetic anisotropy magnetoresistive random access memory cell, a spin orbit torque driven magnetoresistive random access memory cell, a phase change random access memory cell, and a reversible resistance-switching random access memory cell.

13. A system comprising:
a control circuit configured to:
first read a plurality of resistance-switching memory cells comprising a block of data;
decode the first read block of data using an error correction code decoder;
selectively second read the plurality of resistance-switching memory cells based on results of the decoding by performing an overwrite-read process to read the block of data, wherein for each resistance-switching memory cell of the plurality of resistance-switching memory cells the overwrite-read process comprises:
applying a read voltage to the resistance-switching memory cell to determine a first memory cell resistance;
applying a first write voltage to the resistance-switching memory cell;
determining a second memory cell resistance of the resistance-switching memory cell at the first write voltage; and
comparing the first memory cell resistance to the second memory cell resistance to determine that the resistance-switching memory cell is in a first memory state or a second memory state.

14. The system of claim 13, wherein the first write voltage does not switch a memory state of the resistance-switching memory cell.

15. The system of claim 13, wherein the control circuit is further configured to:
determine that the first memory cell resistance is less than the second memory cell resistance;
apply a second write voltage to the resistance-switching memory cell; and
determine that the resistance-switching memory cell is in the first memory state.

16. The system of claim 15, wherein:
the first write voltage switches the resistance-switching memory cell from the first memory state to the second memory state; and
the second write voltage switches the resistance-switching memory cell from the second memory state to the first memory state.

17. The system of claim 13, wherein the control circuit is further configured to:
determine that the first memory cell resistance is not less than the second memory cell resistance; and
determine that the resistance-switching memory cell is in the second memory state.

18. The system of claim 13, wherein the control circuit is further configured to:
determine that the first memory cell resistance is greater than the second memory cell resistance;
apply a second write voltage to the resistance-switching memory cell; and
determine that the resistance-switching memory cell is in the second memory state.

* * * * *